US010424752B2

(12) United States Patent
Rutherglen et al.

(10) Patent No.: US 10,424,752 B2
(45) Date of Patent: Sep. 24, 2019

(54) FIELD EFFECT TRANSISTOR WITH P-DOPED CARBON NANOTUBE CHANNEL REGION AND METHOD OF FABRICATION

(71) Applicant: Carbonics Inc., Marina del Rey, CA (US)

(72) Inventors: Christopher Michael Rutherglen, Marina del Rey, CA (US); Ahmad Nabil Abbas, Marina del Rey, CA (US)

(73) Assignee: Carbonics Inc., Marina del Rey, CA (US)

( * ) Notice: Subject to any disclaimer, the term of this patent is extended or adjusted under 35 U.S.C. 154(b) by 212 days.

(21) Appl. No.: 15/332,665

(22) Filed: Oct. 24, 2016

(65) Prior Publication Data

US 2018/0114934 A1   Apr. 26, 2018

(51) Int. Cl.
| | | |
|---|---|---|
| *H01L 51/10* | (2006.01) | |
| *H01L 51/00* | (2006.01) | |
| *H01L 51/05* | (2006.01) | |

(52) U.S. Cl.
CPC .......... *H01L 51/107* (2013.01); *H01L 51/002* (2013.01); *H01L 51/0048* (2013.01); *H01L 51/0558* (2013.01); *H01L 51/0525* (2013.01)

(58) Field of Classification Search
CPC .................................................. H01L 51/0558
See application file for complete search history.

(56) References Cited

U.S. PATENT DOCUMENTS

| | | |
|---|---|---|
| 9,425,405 B1 | 8/2016 | Arnold et al. |
| 2009/0108251 A1* | 4/2009 | Kabir ............... B82Y 10/00 257/14 |
| 2009/0286066 A1 | 11/2009 | Burke et al. |
| 2012/0248416 A1* | 10/2012 | Zhou ............... B82Y 10/00 257/29 |

(Continued)

OTHER PUBLICATIONS

Ha, T-J, et al., "Highly Uniform and Stable n-Type Carbon Nanotube Transistors by Using Positively Charged Silicon Nitride Thin Films," Nano Letters, 2014, American Chemical Society, ACS Publications, pp. 392-397.

(Continued)

*Primary Examiner* — Abul Kalam

(57) ABSTRACT

Electrical device comprising a field effect transistor (FET). The FET includes a substrate with a channel region thereon, the channel region including a film of single-walled carbon nanotubes located on the substrate, metallic source and drain electrodes layers on the channel region and gate structure covering a portion of channel region and located between the metallic source and drain electrode layers. The gate structure includes a gate dielectric layer on the portion of the channel region and a gate electrode layer on the gate dielectric layer. Other non-gate-covered portions of the channel region are located between the source electrode layer and the gate structure and between the drain electrode layer and the gate structure. The FET includes a stoichiometrically oxygen-reduced silicon oxide layer contacting the non-gate-covered portions of the channel region, wherein the stoichiometrically oxygen-reduced silicon oxide composition includes $SiO_x$ where x has a value of less than 2.

20 Claims, 21 Drawing Sheets

(56) References Cited

U.S. PATENT DOCUMENTS

Figure 1A:
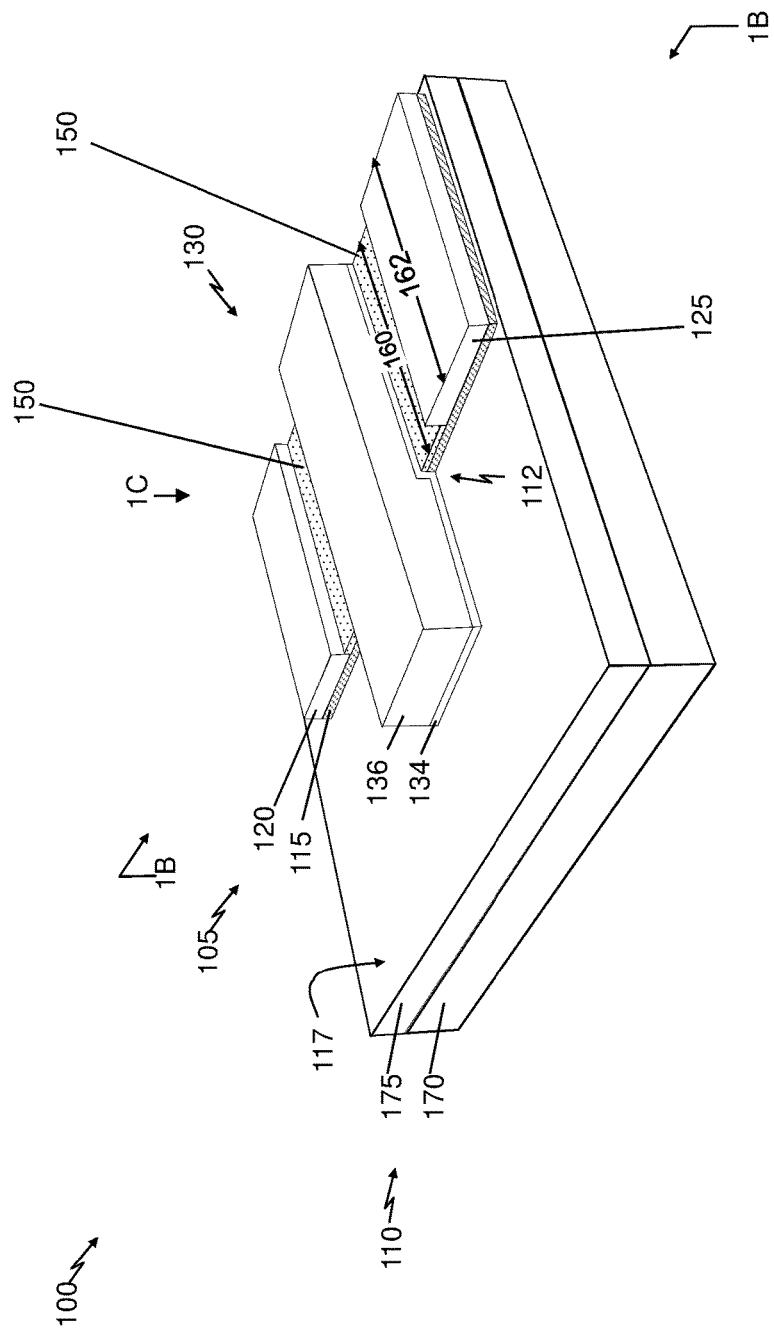

2016/0172596 A1* 6/2016 Rutherglen ......... H01L 51/0023
 257/9
2017/0102358 A1* 4/2017 Hoffman ........... H01L 21/76883

OTHER PUBLICATIONS

Hellstrom, S. L., et al., "Strong and Stable Doping of Carbon Nanotubes and Graphene by MoOx for Transparent Electrodes," Nano Letters, 2012 American Chemical Society, ACS Publications, pp. 3574-3580.

* cited by examiner

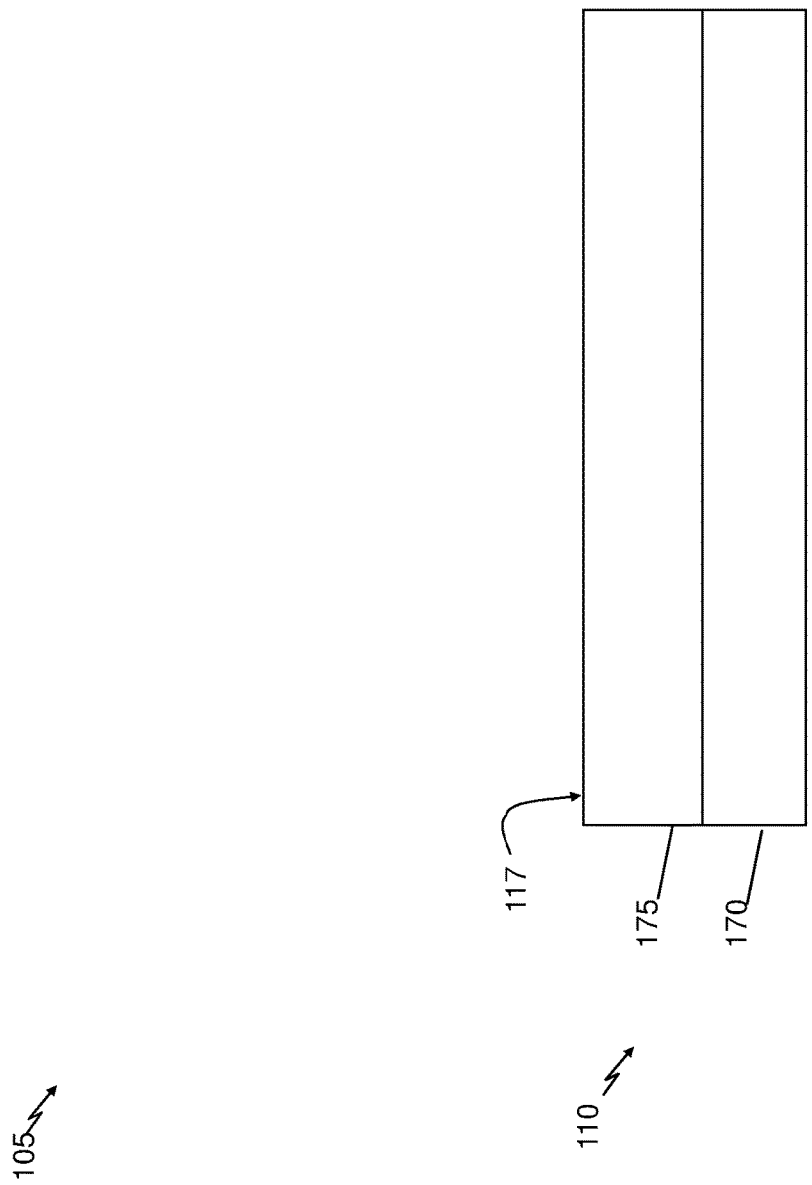

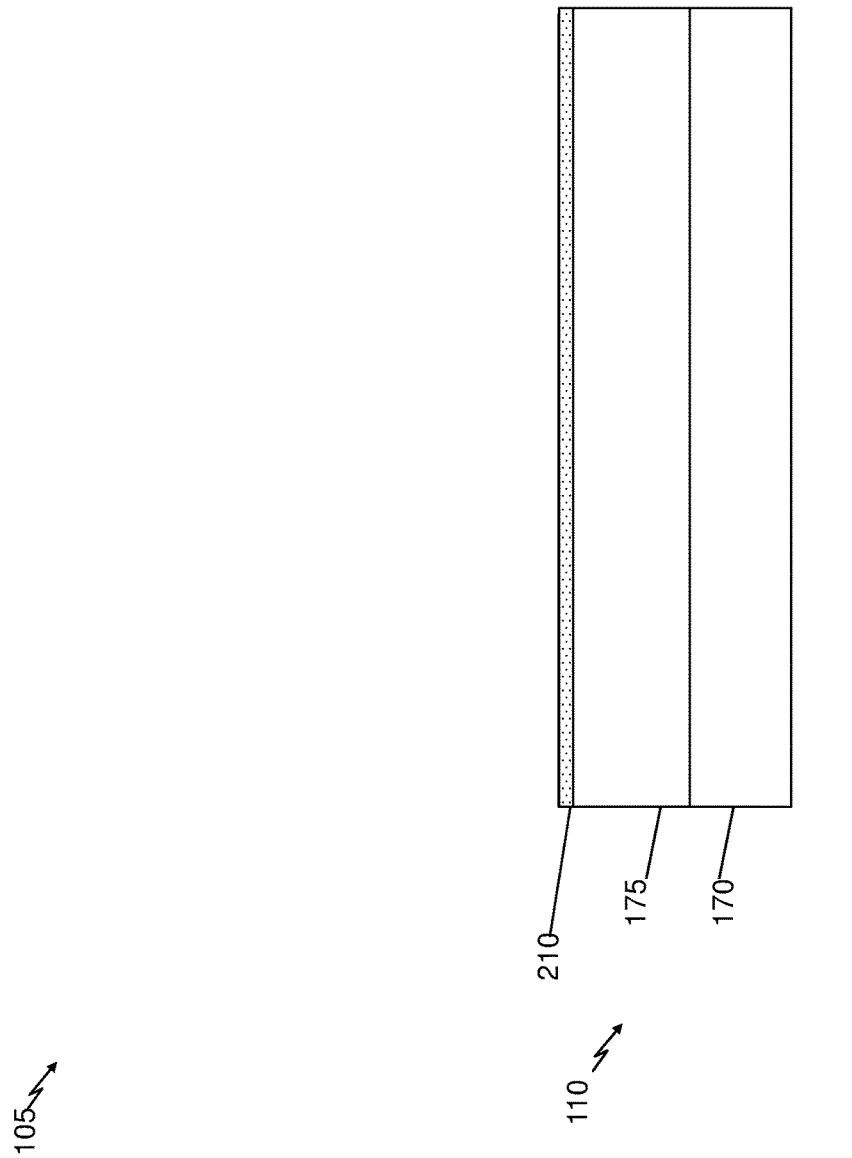

FIELD EFFECT TRANSISTOR WITH P-DOPED CARBON NANOTUBE CHANNEL REGION AND METHOD OF FABRICATION

TECHNICAL FIELD

This application is directed, in general, to field effect transistors, and more specifically, field effect transistors with p-doped carbon nanotube channel regions and methods of manufacturing such transistors.

BACKGROUND

Field effect transistors (FETs) that include channel regions composed of carbon nanotubes (CNTs) have the potential to replace and improve upon transistor speed and performance, as compared to conventional metal-oxide-semiconductor based FETs. To improve the speed and performance of such CNT FETs, it is important to minimize source/drain series resistance, while preserving a high $I_{on}/I_{off}$ ratio.

SUMMARY

One embodiment is an electrical device comprising a field effect transistor. The field effect transistor includes a substrate with a channel region thereon, the channel region including a film of single-walled carbon nanotubes located on the substrate. The field effect transistor also includes metallic source and drain electrodes layers on the channel region. The field effect transistor further includes a gate structure covering a portion of the channel region and located between the metallic source and drain electrode layers. The gate structure includes a gate dielectric layer on the portion of the channel region and a gate electrode layer on the gate dielectric layer, wherein other non-gate-covered portions of the channel region are located between the source electrode layer and the gate structure and between the drain electrode layer and the gate structure. The field effect transistor includes a stoichiometrically oxygen-reduced silicon oxide layer contacting the non-gate-covered portions of the channel region, wherein the stoichiometrically oxygen-reduced silicon oxide composition includes $SiO_x$ where x has a value of less than 2.

Another embodiment is a method comprising forming an electrical device having a field effect transistor. Forming the field effect transistor includes providing a substrate and forming a channel region including depositing a film of single-walled carbon nanotubes on the substrate. Forming the field effect transistor also includes forming metallic source and drain electrodes layers on the channel region and forming a gate structure contacting a portion of the channel region and located in-between the metallic source and drain electrode layers. The gate structure includes a gate dielectric layer on the portion of the channel region and a gate electrode layer on the gate dielectric layer, wherein other non-gate-covered portions of the channel region are located between the source electrode layer and the gate structure and between the drain electrode layer and the gate structure. Forming the field effect transistor further includes depositing a stoichiometrically oxygen-reduced silicon oxide layer contacting the non-gate-covered portions of the channel region, wherein the stoichiometrically oxygen-reduced silicon oxide composition includes $SiO_x$ where x has a value of less than 2.

BRIEF DESCRIPTION

Figure 1B:
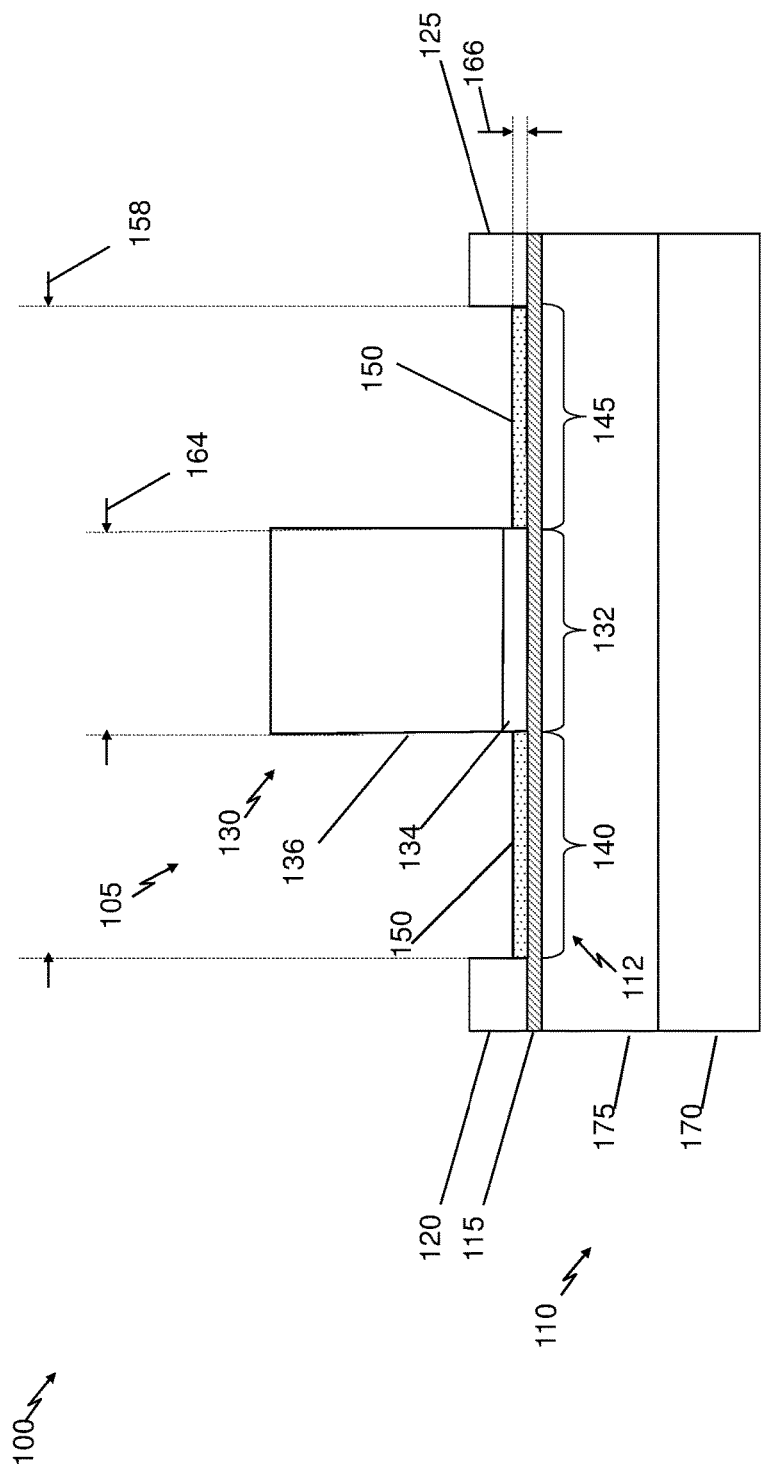
Figure 1C:
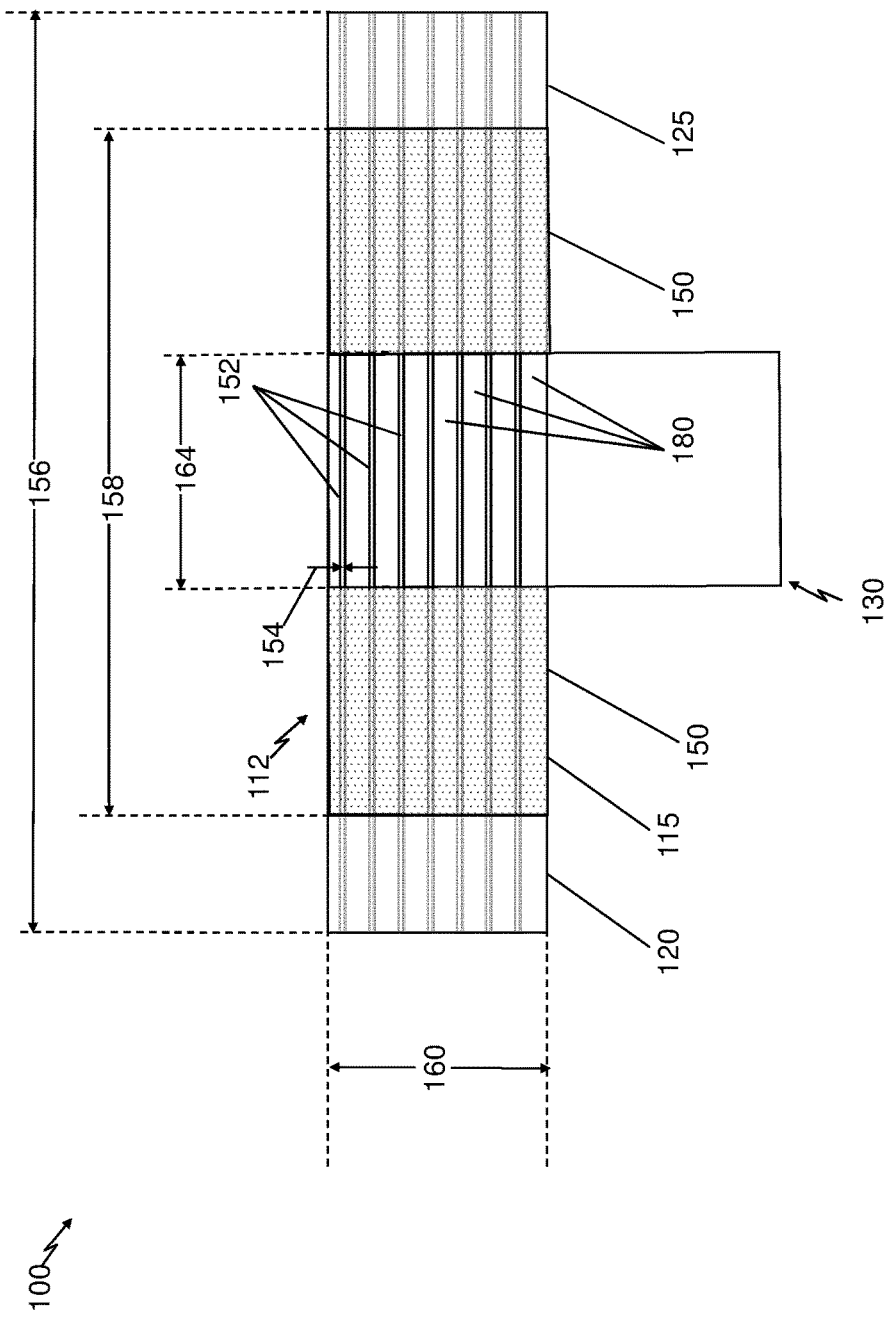
Figure 2:
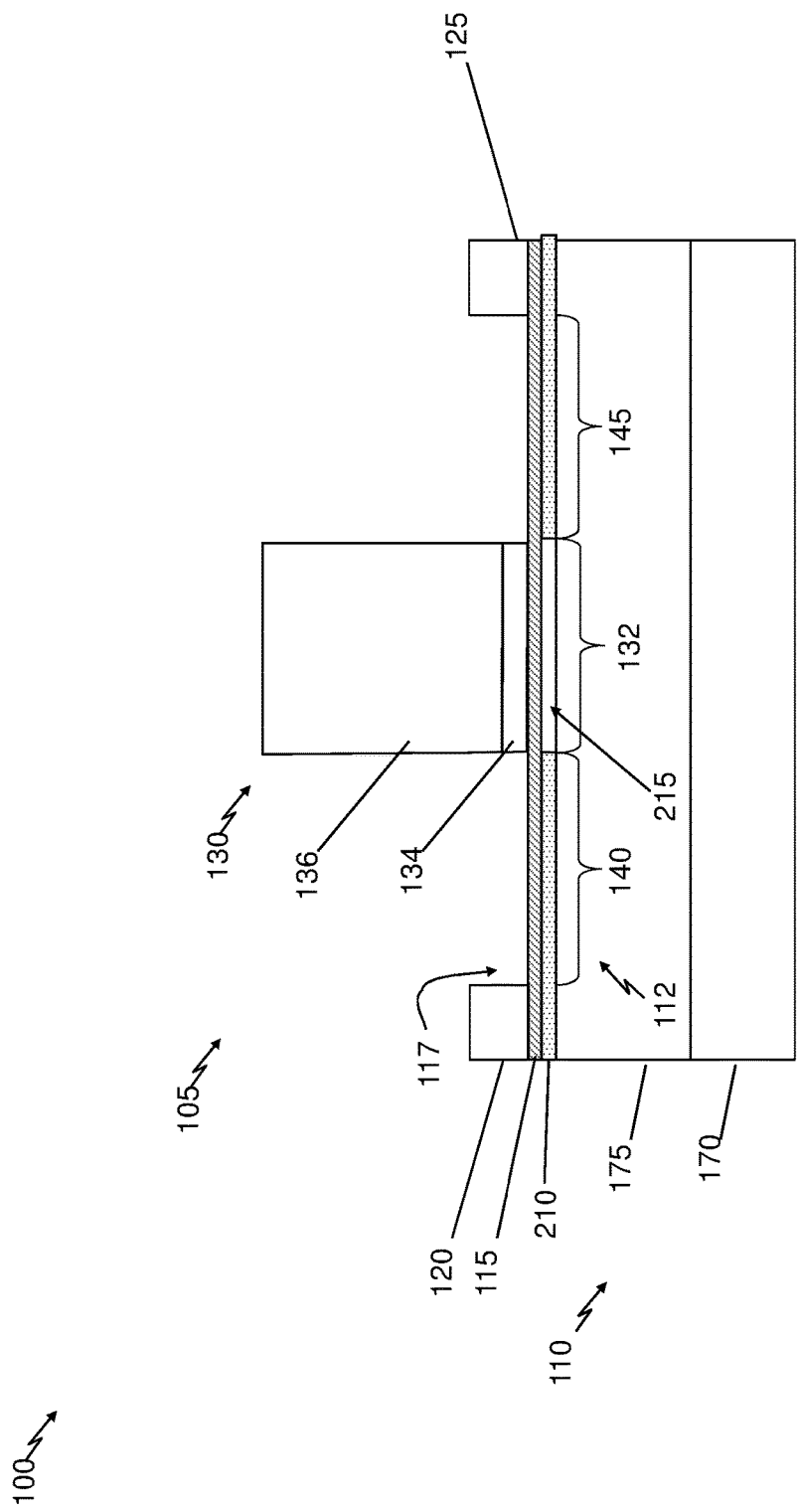
Figure 3:
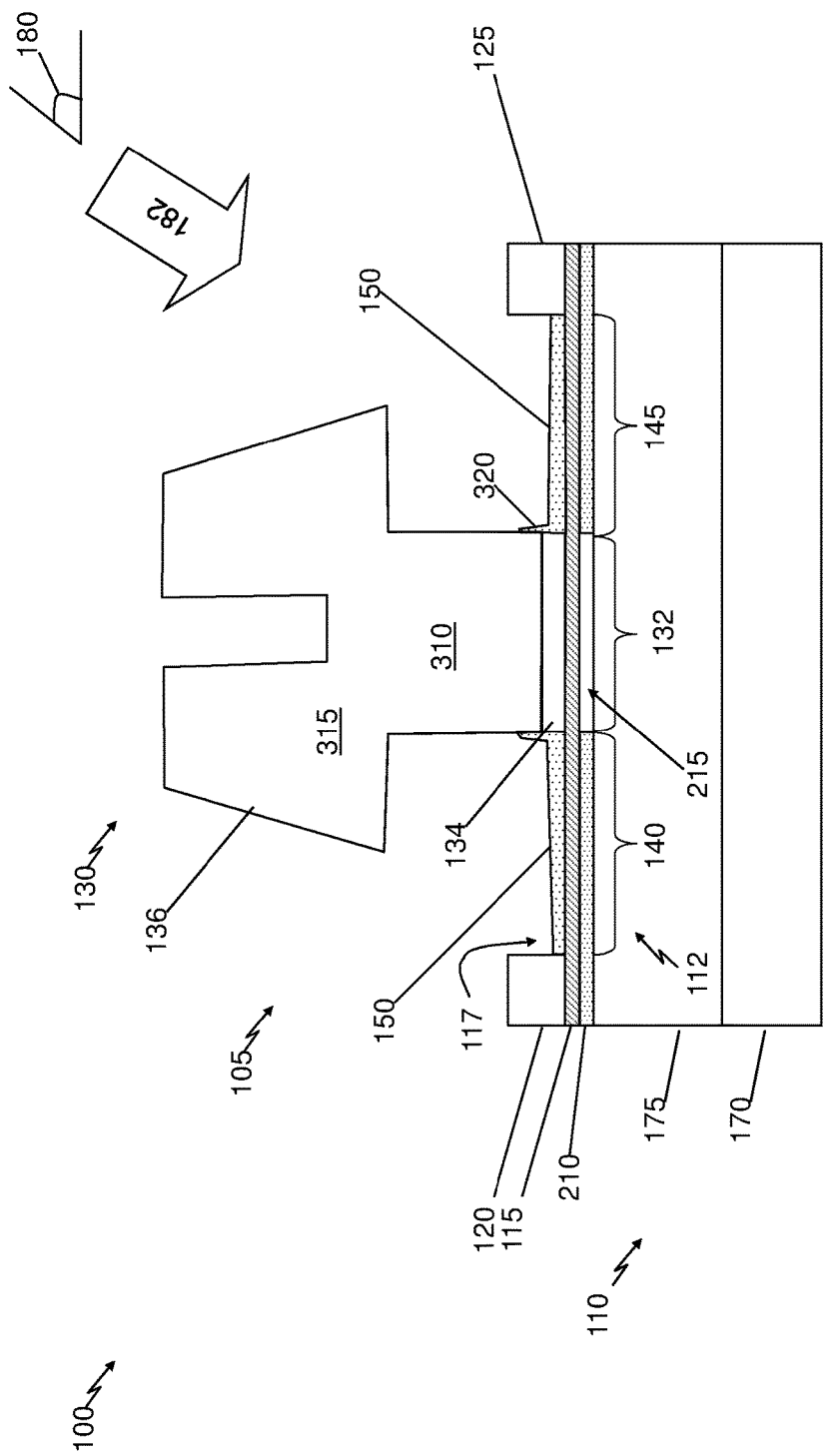
Figure 4:
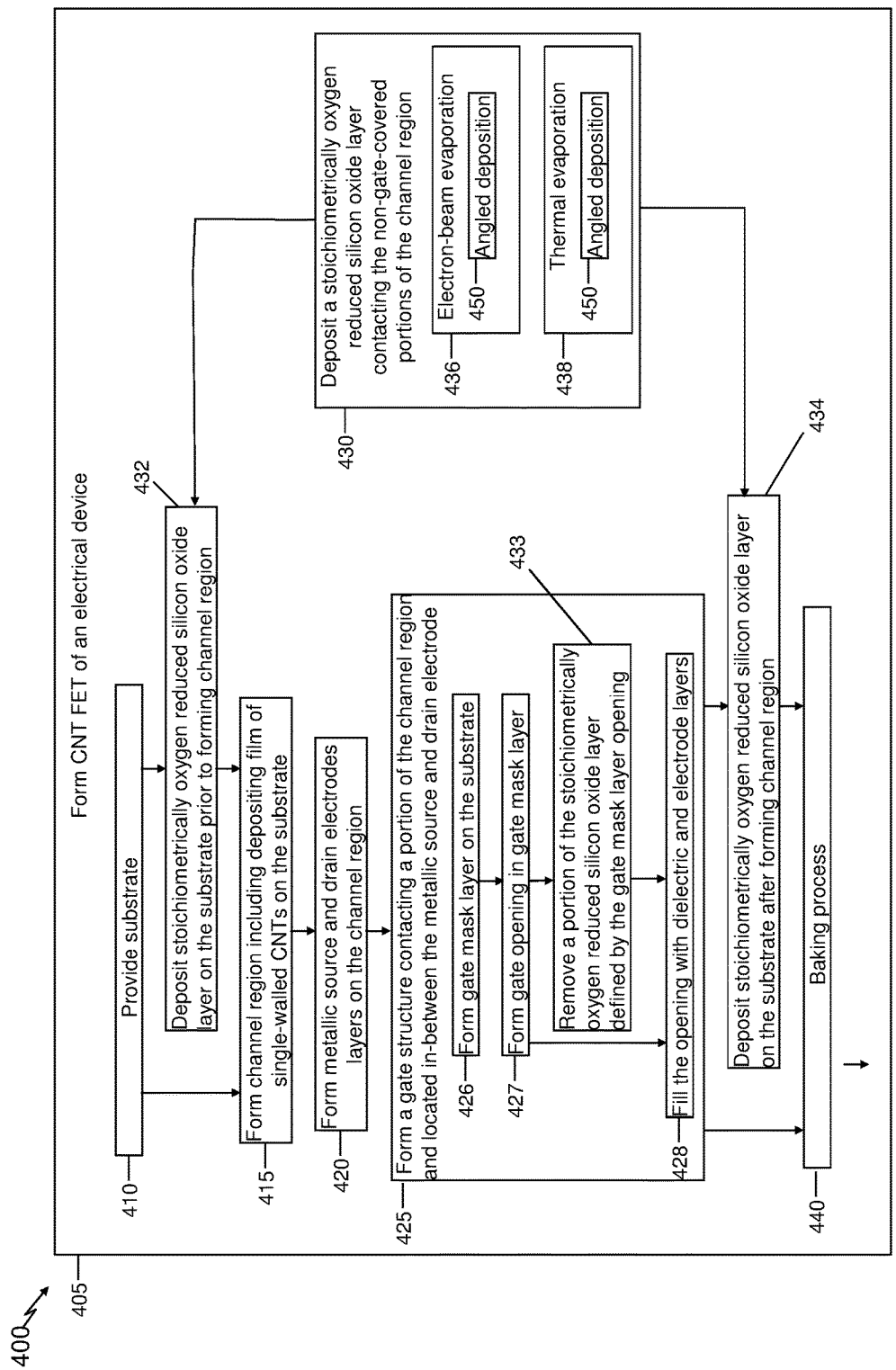
Figure 7:
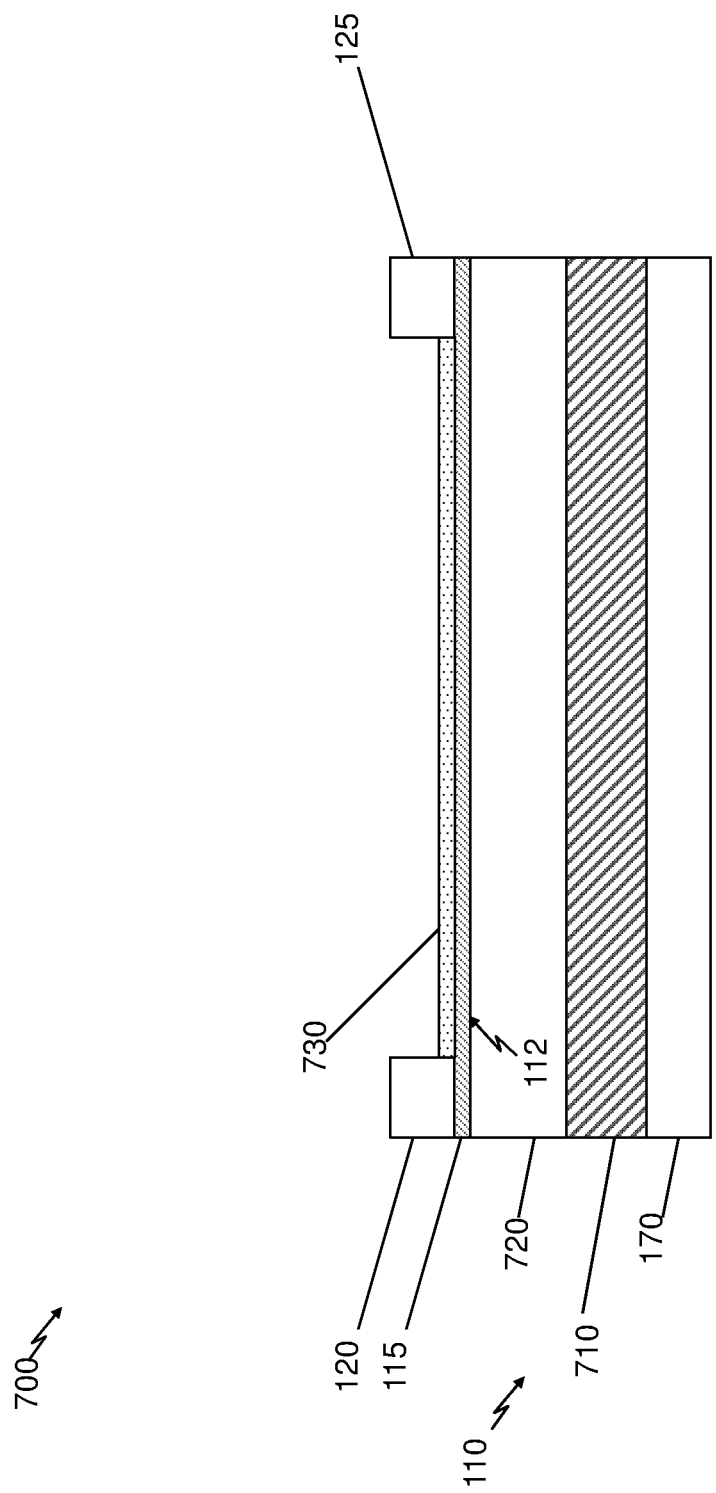
Figure 8:
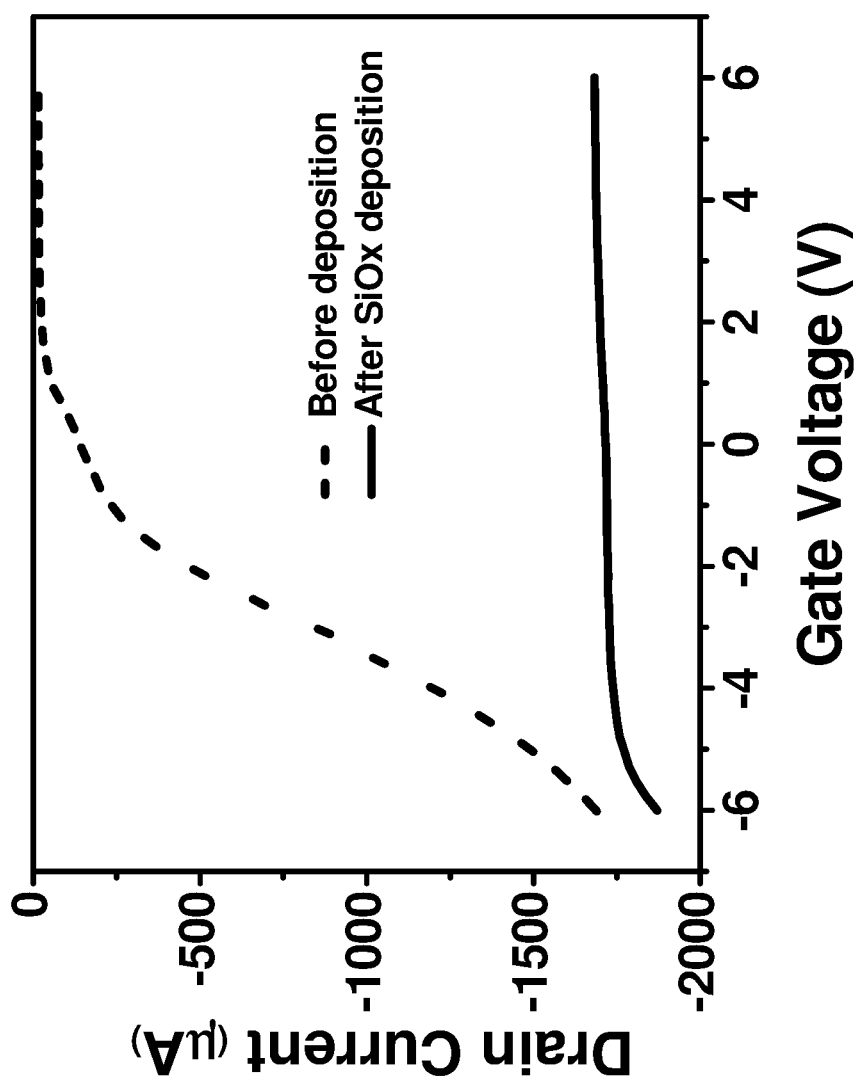
Figure 9:
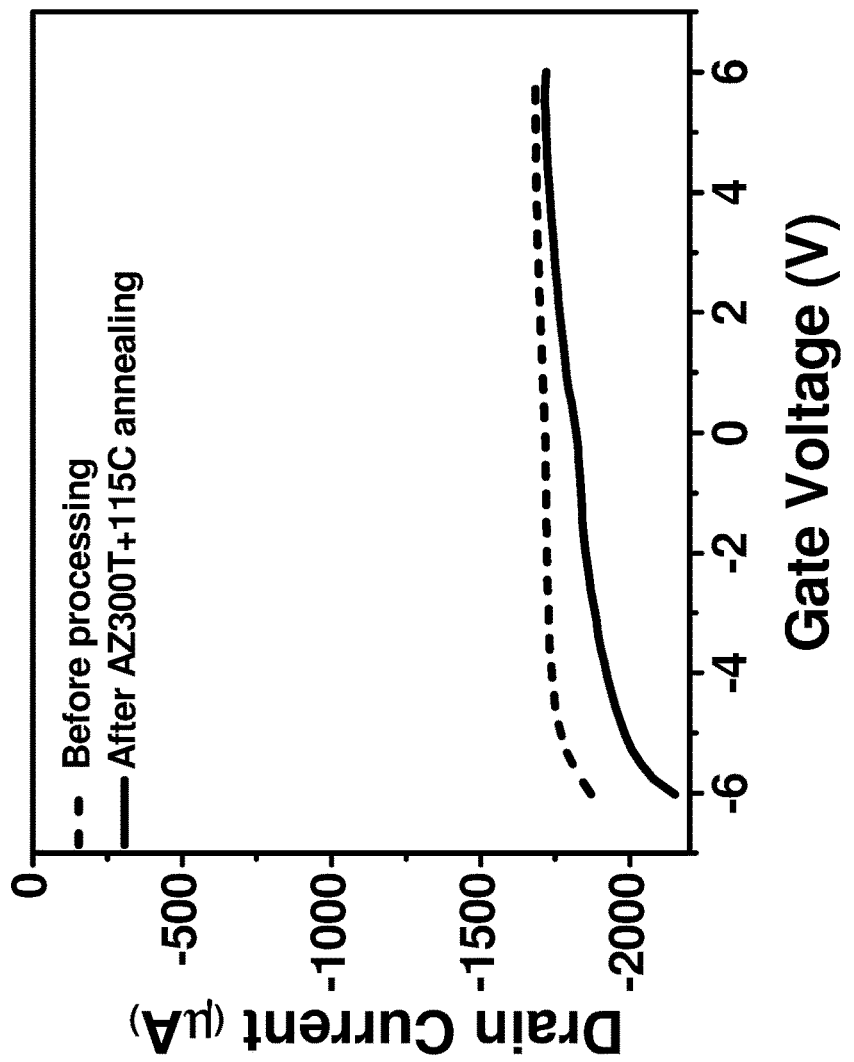

The embodiments of the disclosure are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which:

FIG. 1A presents a perspective view of device that comprises an example embodiment of a top-gated CNT FET of the disclosure;

FIG. 1B presents a cross-sectional view of an example embodiment of a top-gated CNT FET of the disclosure similar to the top-gated CNT FET depicted in FIG. 1A (e.g., along view line 1B-1B);

FIG. 1C presents a top plan view of an example embodiment of a top-gated CNT FET of the disclosure similar to the top-gated CNT FET depicted in FIG. 1A (e.g., along view line 1C);

FIG. 2 presents a cross-sectional view, similar to that depicted in FIG. 1B, of another example embodiment of a top-gated CNT FET of the disclosure;

FIG. 3 presents a cross-sectional view, similar to that depicted in FIG. 1B, of another example embodiment of a top T-shaped gated CNT FET of the disclosure;

FIG. 4 presents a flow diagram of an example method of the disclosure comprising forming an electrical device having a CNT FET such as any of the example embodiment CNT FETs disclosed in the context of FIGS. 1A-3;

FIGS. 5A-5G present cross-sectional views, analogous to the view presented in FIG. 1B, to shown example CNT FETs 105 of the disclosure at intermediate stages of fabrication according a method embodiment of the disclosure, such as disclosed in the context of FIG. 4;

FIGS. 6A-6E present cross-sectional views, analogous to the view presented in FIG. 1B, to shown example CNT FETs 105 of the disclosure at intermediate stages of fabrication according another method embodiment of the disclosure, such as disclosed in the context of FIG. 4;

FIG. 7 shows an experimental back-gated CNT FET used to examine the effects of p-type doping effects in accordance with the disclosure;

FIG. 8 presents example data showing the relationship between drain current and gate voltage for an example experimental back-gated CNT FET similar to that shown in FIG. 7, either with or without the p-type doping of the disclosure; and FIG. 9 presents example data showing the relationship between drain current and gate voltage for an example experimental back-gated CNT FET similar to that shown in FIG. 7, with the p-type doping of the disclosure and either and with or without a thermal bake process.

DETAILED DESCRIPTION

Embodiments of the present disclosure benefit from the recognition that top-gated CNT FET have channel regions that include semiconducting CNT films that remain non-gate covered, e.g., that are not electrostatically controlled by the top gate structure, and, that can contribute a large parasitic series resistance between the source and drain. Such large parasitic series resistances, in turn, can detrimentally reduce the $I_{on}/I_{off}$ ratio, $I_{on}$, and the transconductance of such CNT FETs.

While not limiting the scope of the disclosure by theoretical considerations, we believe that the non-gate-covered portions of the channel region can have a low charge carrier density and thus possess small conductivities. We also believe that the non-gate-covered portions of the channel region can have Schottky barriers at CNT-source or CNT-drain contacts or at CNT-CNT junctions and thus have increased resistivity. We further believe that p-type doping (e.g., degenerately doping) these non-gate-covered portions of the channel region can advantageously reduce their field-effect dependence and series resistance by increasing their carrier density and/or thinning the Schottky barrier width.

In particular, as disclosed herein, such p-type doping can be achieved by depositing a stoichiometrically oxygen-reduced silicon oxide layer such that it contacts the non-gate-covered portions of the channel region. While not limiting the scope of the disclosure by theoretical considerations, we believe that oxygen vacancies in the stoichiometrically oxygen-reduced silicon oxide layer can create defect states that can cause charge transfer to the CNT surface contacting it and thus impart a p-type doping effect. Moreover, embodiments of such stoichiometrically oxygen-reduced silicon oxide layers and methods of depositing as disclosed herein are thermally stable, electrically insulating (e.g., resistivity of less than about 10 MΩ-cm), and can be scalably formed in a manner compatible with standard lithographic processes for fabricating top-gated FETs.

We believe that the disclosed p-type doping effect of the stoichiometrically oxygen-reduced silicon oxide layer and methods of depositing such a layer, stands in contrast to, and are non-obvious in view of, layers of silicon dioxide, hafnium oxide or aluminum oxide which we found to not impart such a p-type doping effect to semiconducting CNTs. We believe that the disclosed stoichiometrically oxygen-reduced silicon oxide layers and methods of depositing are also in contrast to, and non-obvious in view of, layers of molybdenum oxide which we found to slightly conductive which can result in leakage- and other parasitic-currents impairing the device performance. Moreover molybdenum oxide was found to be slightly soluble in water and weak bases, and therefore, prone to being etched or in some cases entirely removed during standard lithographic processing.

One embodiment of the disclosure is an electrical device comprising a FET. FIG. 1A presents a perspective view of a device 100 that comprises an example embodiment of a top-gated CNT FET 105 of the disclosure and FIGS. 1B and 1C present cross-sectional and plan views of an example embodiment of a top-gated CNT FET 105 of the disclosure, respectively, similar to the top-gated CNT FET depicted in FIG. 1A (e.g., along view line 1B-1B and 1C, respectively). FIGS. 2-3 present cross-sectional views, similar to that depicted in FIG. 1B, of other example embodiments of top-gated CNT FETs 105 of the disclosure.

With continuing reference to FIGS. 1A-3, embodiments of the FET 105 include a substrate 110 with a channel region 112 thereon, the channel region 112 including a film 115 of single-walled CNTs located on the substrate 110. (e.g., on a planar surface 117 of the substrate 110). The FET 105 also includes metallic source and drain electrodes layers 120, 125 on the channel region 112.

As illustrated in FIG. 1B, the FET 102 further includes a gate structure 130 covering a portion 132 of the channel region 112 and the gate structure 130 located between the metallic source and drain electrode layers 120, 125. The gate structure 130 includes a gate dielectric layer 134 on the portion 132 of the channel region 112 covered by the gate structure 130, and, a gate electrode layer 136 on the gate dielectric layer 134.

As illustrated in FIG. 1B, other non-gate-covered portions 140, 145 of the channel region 112 are located between the source electrode layer 120 and the gate structure 130 and between the drain electrode layer 125 and the gate structure 130. A stoichiometrically oxygen-reduced silicon oxide layer 150 contacts the non-gate-covered portions 140, 145 of the channel region 112, wherein the stoichiometrically oxygen-reduced silicon oxide composition includes $SiO_x$, where x has a value of less than 2, In some embodiments, e.g., of the layer 150 x has a value in a range between 2 and 1.

In some embodiments of the FET 105, the stoichiometrically oxygen-reduced silicon oxide layer 150 composition consists essentially of $SiO_x$, e.g., at least about 99 mol % $SiO_x$ and in some embodiments at least about 99.9 mol % $SiO_x$. In some such embodiments the layer 150 contains less than 1 mol % (and in some embodiments less than 0.1 mol %) of non-SiOx materials, including materials such as SiON or $SiO_2$ which may detrimentally affect the desired type doing effect. For example, the presence of nitrogen atoms is expected to produce an undesirable n-type doping effect, e.g., for PECVD deposited $SiN_x$, and $SiO_2$ was not observed to have a p-type doping effect.

In some embodiments of the 105, the stoichiometrically oxygen-reduced silicon oxide layer 150 has an amorphous structure. While not limiting the scope of the disclosure by theoretical considerations, we believe that at least for some embodiments, an amorphous layer 150 is conducive to creating defect states that can cause charge transfer and thereby facilitate p-doping of the CNT film 115.

A characteristic of the p-type doping of the non-gate-covered portions 140, 145 of the channel region 112 provided by the stoichiometrically oxygen-reduced silicon oxide layer 150 is demonstrated by the ON-current ($I_{on}$) of these non-gate-covered portions being invariant with respect to the gate voltage. For example, in some embodiments, the $I_{on}$ of the non-gate-covered portions 140, 145 changed by less than 10 percent over an applied gate voltage range of −6 to +6 Volts. Such a characteristic is equivalent to the non-gate-covered portions 140, 145 of the channel region 112 never being in an off-state, with no substantial contribution to the series resistance regardless of the applied gate voltage of the FET 105.

As illustrated in FIG. 1B, in some embodiments of the FET 105, the stoichiometrically oxygen-reduced silicon oxide layer contacts the non-gate covered portions 140, 145 by the layer 150 covering the non-gate covered portions 140, 145 of the channel region 112. That is, the layer 150 is located on the non-gate covered portions 140, 145. As further illustrated in FIG. 1B, in some such embodiments, the CNT film 115 is on the substrate 110, the source and drain electrode layers 120, 125 are on the CNT film 115 and the stoichiometrically oxygen-reduced silicon oxide layer 150 is on the non-gate covered portions 140, 145 of the CNT film 115. At least in some embodiments, having the stoichiometrically oxygen-reduced silicon oxide layer 150 on top of the CNT film 115 can provide the advantage of self-alignment with the gate electrode structure 130.

In some embodiments of the FET 105, the film 115 of single-walled CNTs consists essentially of semiconductor single-walled carbon nanotubes. For example, in some embodiments, the film 115 of single-walled CNTs is composed of at least about 99 mol % and in some embodiments 99.9 mol % of semiconductor single-walled carbon nanotubes. Some such embodiments the film 115 include less than 1 mol %, and in some embodiments less than 0.1 mol %, of metallic type single walled or double-walled carbon nanotubes, and whose presence could detrimentally decrease the $I_{on}/I_{off}$ ratio of the FET 105.

As illustrated in FIG. 1C, in some embodiments the individual single-walled CNTs 152 have a diameter 154 in a range from about 1 to 2 nanometers. In some embodiments, to reduce the series resistance of the CNT film 115, each CNT 152 of the film 115 has a length 156 that is at least equal to a length 158 of the channel region 112 such that the individual CNTs 150 spans the length 158 between the source and drain electrode layers 120, 125, and in some embodiments a length 156 such that the CNTs 150 under lays and contacts the source and drain electrode layers 120, 125.

In some embodiments, the channel region 112 from the source electrode layer 120 to the drain electrode layer 125 has a length (e.g., length 158 show in FIGS. 1B and 1C) in a range from about 100 to 1000 nanometers, and, the channel region 112 has a width (e.g., width 160 shown in FIGS. 1A and 1C) that is substantially equal to a width of the source electrode layer 120 and the drain electrode layer 120 (e.g., width 162 shown in FIG. 1A) in a range from about 10 to 100 nanometers. In some embodiments, the FET has a gate length (e.g., length 164 shown in FIGS. 1B and 1C) in a range from about 1 to 10 nanometers. In some embodiments the density of CNTs 152 that comprise the film 115 of the channel region 112 is in a range from about 20 to 100 tubes per 1000 nanometers width (e.g., width 160), and in some embodiments about 50 tubes per 1000 nanometer width.

The stoichiometrically oxygen-reduced silicon oxide layer can be scaled to provide a p-type doping effect for a broad range of FET dimensions.

For example, as illustrated in FIG. 1B, to facilitate a heavy p-type doping effect, in some embodiments of the FET 105, the stoichiometrically oxygen-reduced silicon oxide layer 150 has a thickness 166 (e.g., in the dimension perpendicular to the surface 117 of the substrate 110 and in the plane of the cross-sectional view depicted in FIG. 1B) equal to or greater that an average radius of the CNTs 152 (e.g., one-half of the average diameter 154) of the channel region 112.

For example, when the single-walled nanotubes of the CNT film 115 have an average radius of 0.5 nanometers then the layer's 150 (and/or layer 210, discussed in the context of FIG. 2) thickness 166 can equal at least about 0.5 nanometers, and in some embodiments at least about 0.75 nanometers, and in some embodiments at least about 1 nanometer. For example, when the single-walled nanotubes 152 of the CNT film 115 have an average radius of 1 nanometers then the layer's 150 thickness 166 can equal at least about nanometer, and in some embodiments, at least about 1.5 nanometers, and in some embodiments at least about nanometers. For example, in some embodiments the layer 150 (and/or layer 210), thickness 166 is in a range from about 0.5 nanometers to about 3 nanometers.

For example in some embodiments, depending on the gate length (e.g., length 164 shown in FIGS. 1B and 1C) the portion 132 of the channel region 112 covered by the gate structure 130 can correspond to a value in a range from about 10 to 90 percent of a total area of the channel region 112 located between the source electrode layer 120 and the drain electrode layer 125.

For any such embodiments of the channel region 112 length 158, width 160 or gate length 164, the area of the stoichiometrically oxygen-reduced silicon oxide layer (e.g., layer 150 and/or layer 210) can be deposited to substantially contact (e.g., via covering and/or under laying) the entire surface of the non-gate covered portions 140, 145 of the channel region 112 facing the stoichiometrically oxygen-reduced silicon oxide layer (e.g., layer 150 and/or layer 210). For example, in some embodiments, the stoichiometrically oxygen-reduced silicon oxide layer contacts (e.g., via covering and/or under laying) at least about 90 percent, and in some embodiments, at least about 99 percent, of the other non-gate covered portions 140, 145 of the channel region 112 facing the layer (e.g., layer 150 and/or layer 210). In embodiments where the stoichiometrically oxygen-reduced silicon oxide layer (e.g., layer 150 and/or layer 210) contacts less than 90 percent, we still expect there to be a p-type doping effect.

In some embodiments, such as illustrated in FIG. 2, the stoichiometrically oxygen-reduced silicon oxide layer contacts the non-gate covered portions 140, 145 by the channel region 112 covering the underlying stoichiometrically oxygen-reduced silicon oxide layer 210. That is, the layer 210 is located under the non-gate covered portions 140, 145. As further illustrated in FIG. 2, in some such embodiments, the stoichiometrically oxygen-reduced silicon oxide layer 210 is on the substrate 110, the CNT film 115 is on the layer 210, and the source and drain electrode layers 120, 125 are on the CNT film 115 and the layer 210. At least in some embodiments, having the CNT film 115 on top of the stoichiometrically oxygen-reduced silicon oxide layer 210 can have the advantage of p-type doping the portion of the CNT film 115 underneath and contacting the source and drain layer electrodes 120, 125.

In still other embodiments, such as illustrated in FIG. 3, the stoichiometrically oxygen-reduced silicon oxide layer includes a first layer 150 that covers the non-gate covered portions 140, 145 of the channel region 112 and a second layer 210 that under lays the non-gate covered portions 140, 145 of the channel region 112. Some such embodiments having the film 115 sandwiched between such a dual oxygen-reduced silicon oxide layer 150, 210 configuration may advantageously impart a heavier p-type doping effect to the CNT film 115, e.g., as compared to a single oxygen-reduced silicon oxide layer.

As further illustrated in FIG. 3, in some embodiments the gate structure 130 includes a T-shaped gate electrode layer 136. Example embodiments of T-shaped gate electrodes and their fabrication are presented in US. patent application 20160172596 by Rutherglen, filed Dec. 16, 2014 (hereinafter "Rutherglen"), now U.S. Pat. No. 9,379,327, which is incorporated by reference in its entirety herein. As disclosed in Rutherglen, the reduced gate-length afforded by the narrower tail 310 and wider head 315 portions of embodiments of the T-shaped gate electrode layer 136 can beneficially increase the ballistic transport limit, increase the transconductance and cutoff frequency, and lower the thermal noise of the FET 105.

Although a dual oxygen-reduced silicon oxide layer 150, 210 configuration is presented in the context of a T-shaped gate electrode layer shown in FIG. 3, such dual layers 150, 210 configurations could also be used in FETs 105 having a planar gate electrode layer 136 such as shown in FIGS. 1A-2.

As illustrated in FIG. 3, in some embodiments of the FET 105, due to an angled deposition of the stoichiometrically oxygen-reduced silicon oxide, e.g., as further described in the context of FIG. 4 to follow, the thickness of the layer 150 in the vicinity of the gate dielectric layer 134 and gate electrode tail 310 can be greater (e.g., double in some embodiments) than the average thickness 166 of the layer 150, to, e.g., form a sidewall 320 on the gate structure 130. In some embodiments, the angled deposition, due to shadowing from the source or drain electrode layers 120, 125, the thickness of the layer 150 in the vicinity of the source or drain electrode layers 120, 125 can be less (e.g., 50 percent or less in some embodiments) than the average thickness 166 of the layer 150.

As illustrated in FIGS. 2 and 3, in some embodiments of the FET 105, e.g., having an under laying stoichiometrically oxygen-reduced silicon oxide layer 210, the layer 210 directly under the gate covered portion 132 of the channel is removed such that the layer 210 does not contact the gate-covered portion 132 of the channel region 112. In some such embodiments, a gap 215 (e.g., air gap), corresponding to the removed portion of the stoichiometrically oxygen-reduced silicon oxide layer 210, can be present between the substrate 110 (e.g., surface 117) and the CNT film 115 of the channel region.

As illustrated in FIGS. 1A-3, in some embodiments, the substrate 110 includes a silicon base layer 170 and a silicon dioxide layer 175 (e.g., thermal grown silicon dioxide layer) thereon. In other embodiments the substrate can include or be glass with a thermally grown silicon dioxide layer there on. Other example substrates include quartz wafers, silicon wafers, sapphire wafers.

In some embodiments, the CNT FET 105 is part of an amplifier device 100. One skilled in the pertinent arts would understand how the CNT FET 105 could be connected to passive components (e.g., capacitors, inductors or resistors) or active components (e.g., other FETs) to provide an amplifier such as a multistage amplifier configured to e.g., amplify radio-frequency, microwave, or millimeter-wave signals.

Another embodiment of the disclosure is method comprising forming an electrical device having a field effect transistor.

FIG. 4 presents a flow diagram of an example method 400 of the disclosure comprising forming an electrical device 100 (e.g., an amplifier) having a CNT FET (step 405) such as any of the example embodiment CNT FETs 105 disclosed in the context of FIGS. 1A-3.

With continuing reference to FIGS. 1A-3, FIG. 4 illustrates embodiments of the forming the CNT FET (step 405) including: providing a substrate 110 (step 410), forming a channel region 112 including depositing a film 115 of single-walled CNTs on the substrate 110 (step 415), forming metallic source and drain electrodes layers on the channel region (step 420), and, forming a gate structure 130 contacting a portion 132 of the channel region 112 and located in-between the metallic source and drain electrode layers 120, 125 (step 425). The gate structure 130 includes a gate dielectric layer 134 on the portion 132 of the channel region 112 and a gate electrode layer 136 on the gate dielectric layer 134. Other non-gate-covered portions 140, 145 of the channel region 112 are located between the source electrode layer 120 and the gate structure 130 and between the drain electrode layer 125 and the gate structure 130.

Forming the CNT FET (step 405) includes depositing a stoichiometrically oxygen-reduced silicon oxide layer contacting the non-gate-covered portions of the channel region (step 430). The stoichiometrically oxygen-reduced silicon oxide composition includes $SiO_x$ where x has a value of less than 2.

In some embodiments, the depositing step 430 includes depositing a stoichiometrically oxygen-reduced silicon oxide layer (e.g., layer 210) on the substrate 110 prior to forming a channel region 112 (step 432).

In such embodiments, the channel region 112 is then formed by depositing the CNT film 115, as part of step 415, on the stoichiometrically oxygen-reduced silicon oxide layer 210 so that the oxygen-reduced silicon oxide layer under lays the CNT film 115. Then the metallic source and drain electrodes layers 120, 125 are formed on the channel region 112, in accordance with step 420, and, the gate structure 130 is formed on the channel region 112 (e.g., portion 132) and in-between the metallic source and drain electrode layers 120, 125, in accordance with step 425.

As illustrated in FIG. 4, forming the gate structure 130 (e.g., step 425) cab include: forming a gate mask layer, e.g., one or more photoresist layers, on the substrate 110 (step 426), patterning the gate mask layer to form a gate mask opening (e.g., an opening that matches the shape of the target gate structure) in the gate mask layer (step 427), and filling the opening with dielectric and electrode layer materials to form the gate structure 130 (step 428).

In some such embodiments, prior to filling the gate mask opening with dielectric and electrode layers (step 428), a portion of the deposited stoichiometrically oxygen-reduced silicon oxide layer 210 defined by the gate mask opening is removed (e.g., step 434). For example, the gate mask opening can be filled with a buffered-oxide-etchant that removes portion of the layer 210 exposed by the opening. Then, after removing the etchant, the opening can be filled with dielectric and electrode layers in accordance with step 428.

In some embodiments, the depositing step 430 includes depositing a stoichiometrically oxygen-reduced silicon oxide layer (e.g., layer 150) after forming the channel region 112 (e.g., step 434) so that stoichiometrically oxygen-reduced silicon oxide layer covers the CNT film 115. In some embodiments, depositing after forming the channel region 112 (step 434) is also performed after depositing the metallic source and drain electrodes layers on the channel region (step 420), and after depositing the gate structure 130 on the portion 132 of the channel region 112 and in-between the metallic source and drain electrode layers 120, 125 (step 425).

In some embodiments, forming the CNT FET (step 405) as part of step 430 includes both depositing (step 432) the stoichiometrically oxygen-reduced silicon oxide layer 210 and then forming a channel region 112 including depositing the CNT film 115 (step 415) so that the oxygen-reduced silicon oxide layer under lays the CNT film 115, and, depositing (step 434) a second stoichiometrically oxygen-reduced silicon oxide layer 150 on the CNT film 115 so that stoichiometrically oxygen-reduced silicon oxide layer 150 covers the CNT film 115.

As part of the present disclosure we have discovered that depositing a stoichiometrically oxygen-reduced silicon oxide layer (step 430) by an evaporation process facilitates forming the stoichiometrically oxygen-reduced silicon oxide composition $SiO_x$ where X is less than 2.

In some embodiments, depositing the stoichiometrically oxygen-reduced silicon oxide layer (step 430) includes an electron-beam evaporation process (step 436). Some embodiments of the electron beam evaporation process include placing the substrate into a deposition chamber that contain source silicon oxide crystals and directing an electron beam at the source silicon oxide crystals to evaporate the silicon oxide crystals. As a non-limiting example, in some embodiments, source silicon dioxide crystals are placed in the deposition chamber, the chamber's pressure is adjusted to a value in a range from about 0.1 to 1 µTorr and the electron beam is generated using a voltage of about 9.5 kV and the current is adjusted to provide a $SiO_x$ deposition rate in a range from about 0.1 to 3 Angstroms per second.

In some embodiments, depositing the stoichiometrically oxygen-reduced silicon oxide layer (step 430) includes a thermal evaporation process (step 438). Some embodiments of the thermal evaporation process include placing the substrate into a deposition chamber that contain source silicon oxide crystals and heating the source silicon oxide crystals to evaporate the silicon oxide crystals. As a non-limiting example, in some embodiments, source silicon dioxide crystals are placed in the deposition chamber, the chamber's pressure is adjusted to a value in a range from about 0.1 to 1 µTorr and then the source silicon dioxide crystals are heated to a temperature up to about 900° C. In some embodiments, heating to temperatures higher than 900° C. may not be desirable as this may damage the CNT's. In some embodiments the rate of heating can be adjusted to provide a $SiO_x$ deposition rate in a range from about 0.1 to 3 Angstroms per second.

In some embodiments, it can be advantageous to deposit the stoichiometrically oxygen-reduced silicon oxide layer (e.g., via steps 436 or 438) at a rapid rate, e.g., a rate from about 2 to 3 Angstroms per second. For some such embodiments, a greater p-type doping effect was found to exist for such rapidly-deposited stoichiometrically oxygen-reduced silicon oxide layers, as compared to more slowly-deposited layers. While not limiting the scope of the disclosure by theoretical considerations, we believe that such rapidly-deposited layers have a more amorphous structure, or, smaller grain sizes or domains, which in turn is thought to facilitate a more efficient conformal contacting to the CNTs of the film 115 and therefore more efficient p-type doping effect.

For some embodiments, forming the CNT FET (step 405) further including baking the substrate 110 (step 440) after depositing the stoichiometrically oxygen-reduced silicon oxide layer (e.g., layer 150 deposited in step 434 and/or layer 210 deposited in step 432). Embodiments of the baking process can include placing the substrate in an oxygen-containing atmosphere (e.g., air at about 1 atmosphere pressure) and heating to a temperature value in a range from 115 to 250° C. for about 1 to 10 minutes. For some such embodiments, as further disclosed in the Experimental Results section to follow, a greater p-type doping effect was found to exist for FETs after the baking process (step 440) as compared to FETs not exposed to the baking process.

In some embodiments, depositing the stoichiometrically oxygen-reduced silicon oxide layer (step 430) can further include an angled deposition process (step 450) where as part of step 436 or 438, and as illustrated in FIG. 3, the plane of the substrate surface 117 forms an angle 180 relative to the average flow direction (e.g., flow direction 185) of the evaporating source material that is in a range from 20 to 70 degrees. Such an angled deposition can be advantageous when, e.g., the gate electrode layer 136 has a T-shape and the wider head 315 portion would otherwise block the deposition of stoichiometrically oxygen-reduced silicon oxide ($SiO_x$), e.g., if deposited at a perpendicular angle (e.g., angle 180 equal to about 90 degrees). In some embodiments, the angled deposition (step 450), especially at angles shallower than 45 angles, may not provide complete coverage of the non-gate covered portions 140, 145 of the channel region 112, e.g., due to shadow masking from the source or drain electrode layers 120, 125. In some such embodiments, the deposition (step 430) can include both perpendicular and angled depositions of stoichiometrically oxygen-reduced silicon oxide via the evaporation processes (e.g., step 436 and/or step 438).

To further illustrate various aspects of these embodiments, FIGS. 5A-5G present cross-sectional views, analogous to the view presented in FIG. 1B, to shown example CNT FETs 105 of the disclosure at intermediate stages of fabrication according to a method embodiment of the disclosure, e.g., such as disclosed in the context of FIG. 4.

With continuing reference to FIG. 4 throughout, FIG. 5A shows the partially completed FET 105 after providing the substrate 110, e.g., in accordance with step 410. In some embodiments, providing the substrate 110 can include providing a silicon wafer base layer 170 and thermally growing a silicon dioxide insulating layer 175 on the base layer 170 to provide a planar surface 117.

FIG. 5B shows the partially completed FET 105 after depositing (e.g., step 430) a stoichiometrically oxygen-reduced silicon oxide layer 210 on the substrate 110, prior to forming a channel region, e.g., in accordance with step 432. Any of the embodiments of depositing disclosed in the context of step 430 can be used to deposit the layer 210.

Figure 5C:
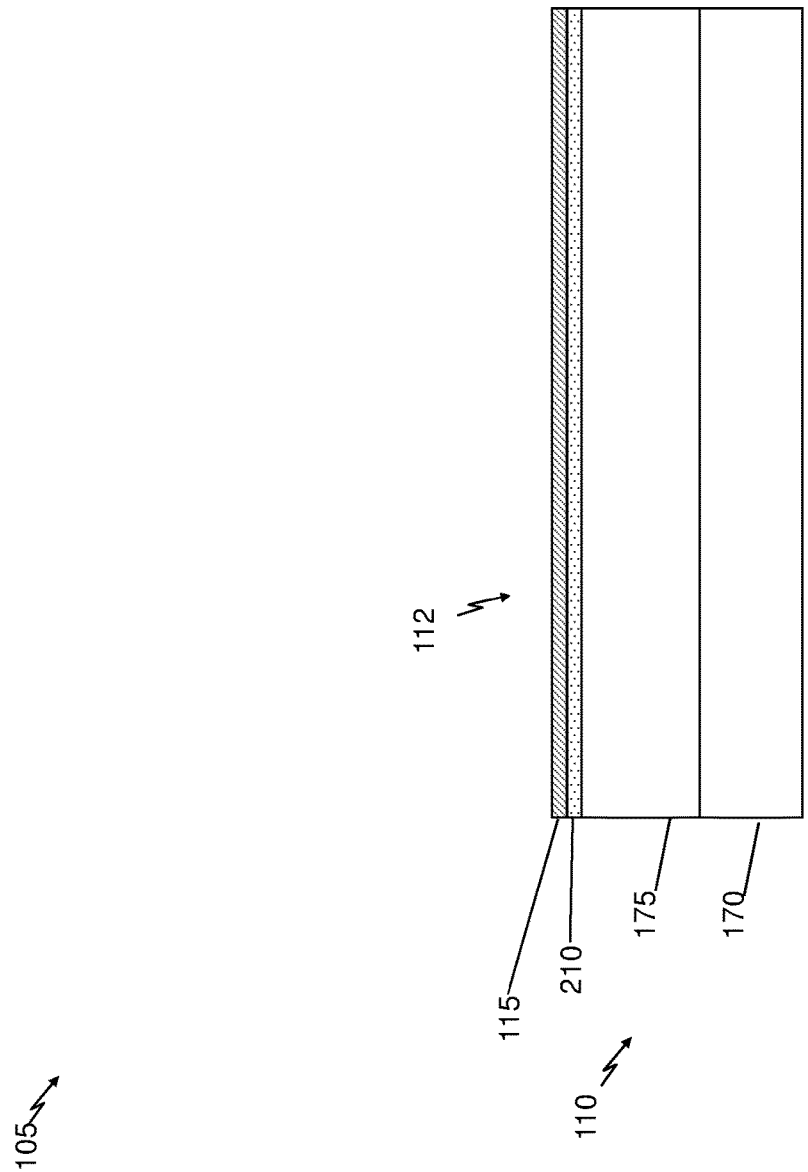

FIG. 5C shows the partially completed FET 105 after forming a channel region 112 including depositing a CNT film 115 on the stoichiometrically oxygen-reduced silicon oxide layer 210 (and the substrate 110), e.g., in accordance with step 415. Non-limiting examples of forming single-walled CNT films are presented in U.S. Patent Application 20090286066 to Burke et al., (now U.S. Pat. No. 8,945,502) or U.S. Pat. No. 9,425,405 to Arnold et al., ("Arnold") which are incorporated by reference in their entirety. For instance, in some embodiments, depositing a CNT film includes the use of a continuous, floating evaporative assembly of aligned carbon nanotubes, such as described by Arnold.

Figure 5D:
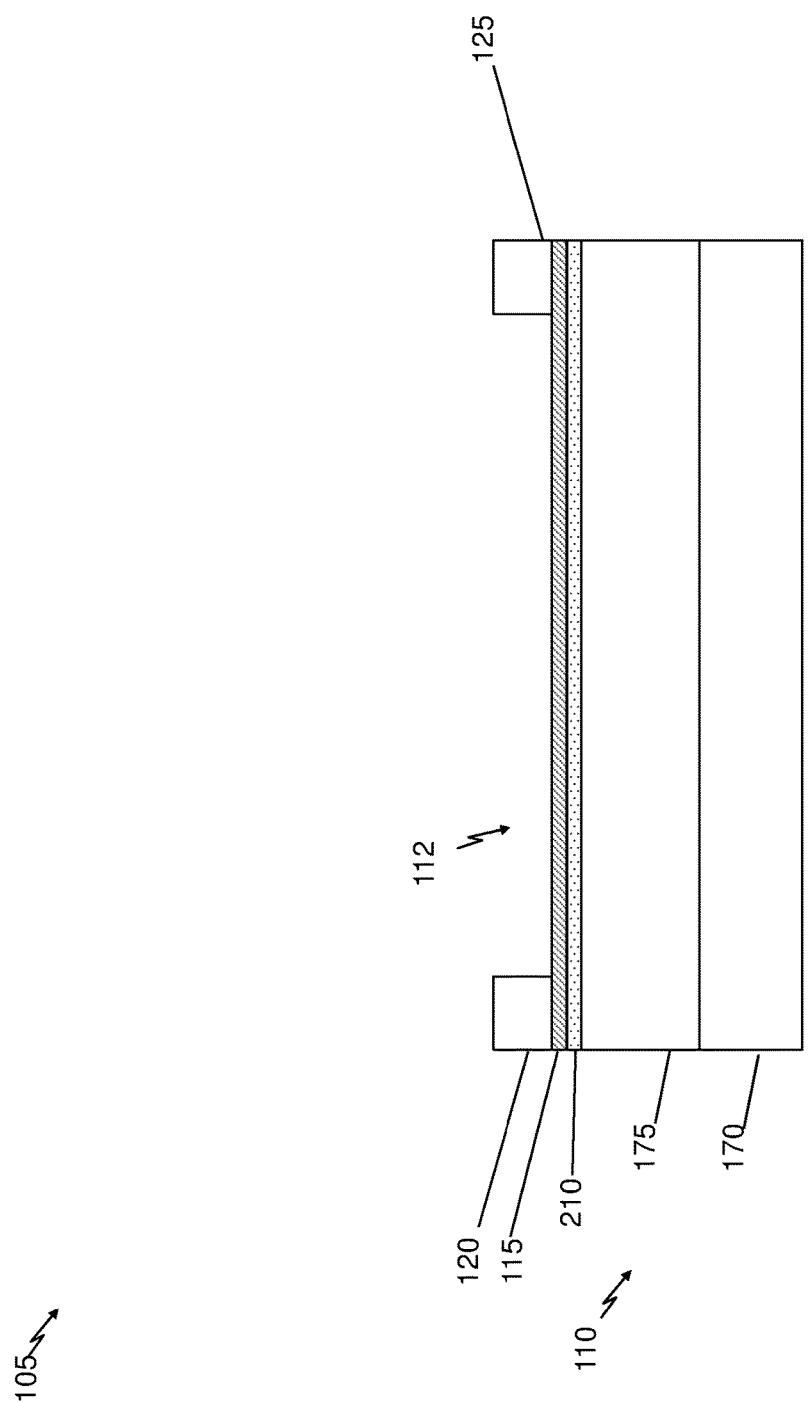

FIG. 5D shows the partially completed FET 105 after forming metallic source and drain electrodes layers 120, 125, e.g., in accordance with step 420, on the CNT film 115, e.g., to form source and drain layers 120, 125 that are self-aligned with the channel region 112. For instance, in some embodiments, forming the layers 120, 125 includes patterning a photoresist layer on the substrate 110 using i-line photolithography to form openings therein, and then evaporating a metal (e.g., Pd) as the electrode contact material in the openings, and using a lift-off process to remove the photoresist to thereby form the source-drain electrode layers 120, 125.

Figure 5E:
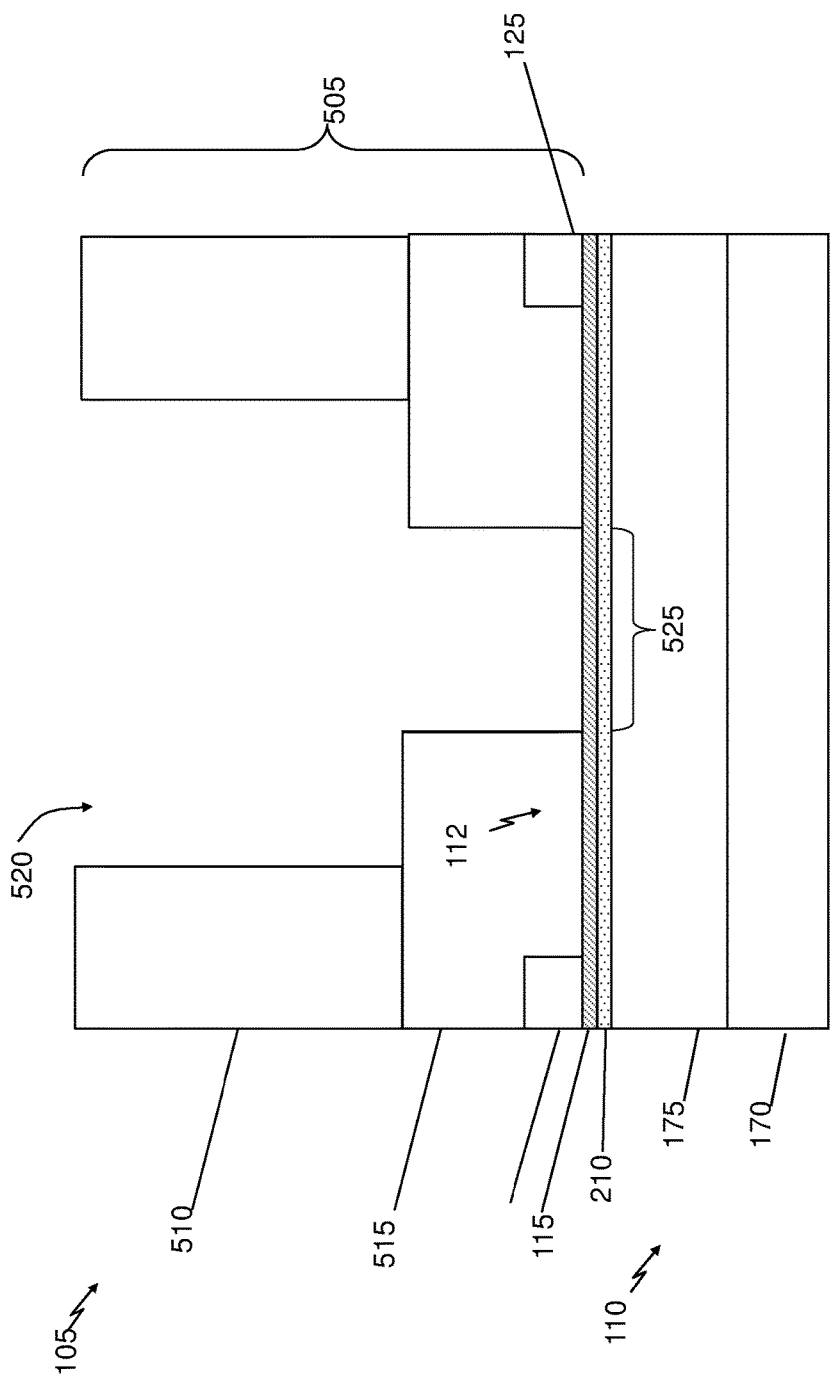
Figure 5F:
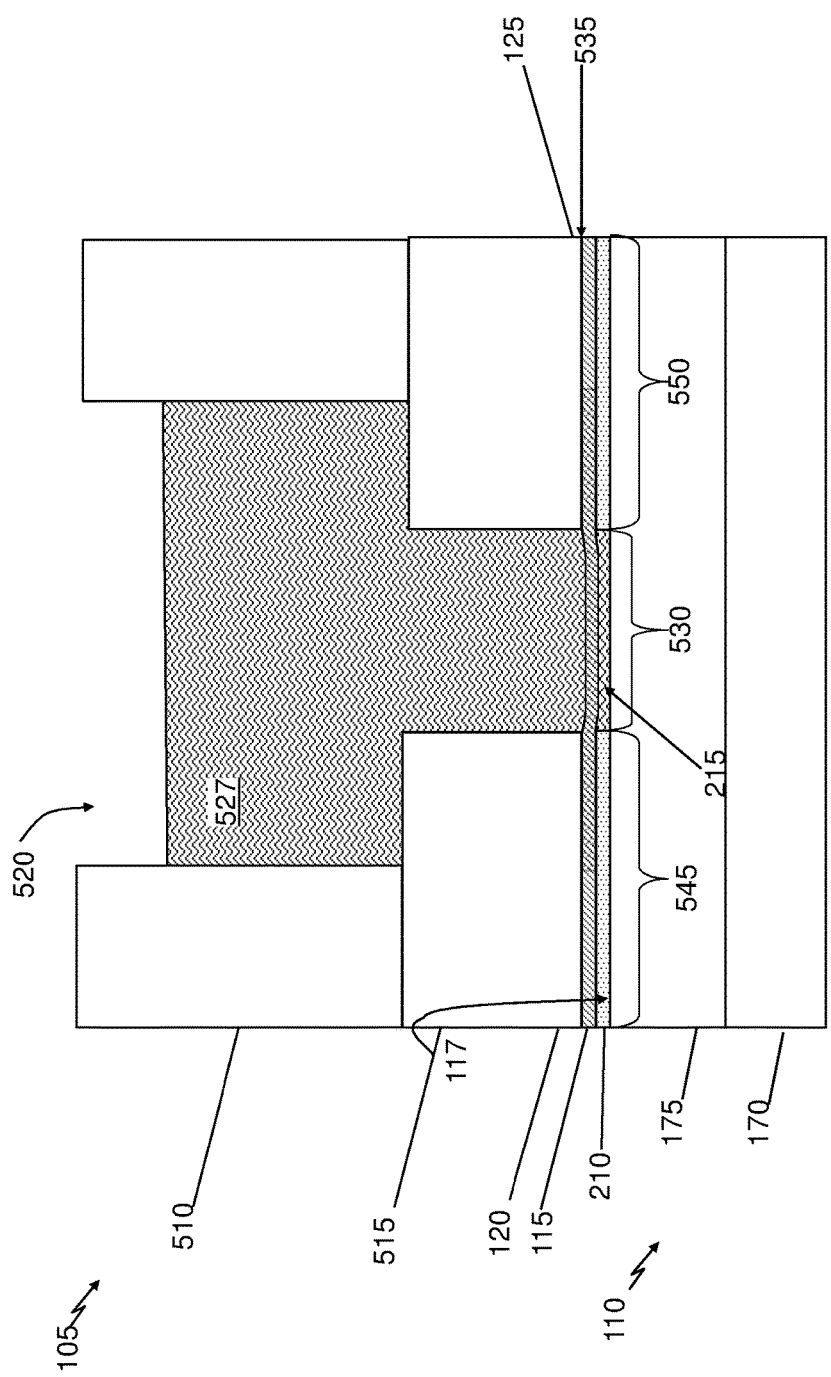

FIG. 5E shows the FIG. 5F shows the partially completed FET 105 after forming a gate mask layer 505 (e.g., comprising photoresist layers 510 and 515 and after patterning the gate mask layer 505 to form a gate mask opening 520 therein (e.g., steps 426 and 427). One skilled in the pertinent art would be familiar with conventional methods to deposit and pattern such photoresist layers.

FIG. 5F shows the partially completed FET 105 after removing (e.g., step 433) a portion of the stoichiometrically oxygen-reduced silicon oxide layer 210 exposed by the gate mask opening 520 (e.g., portion 525 depicted in FIG. 5E), e.g., by filling the opening 520 with an etchant 527. The density of the CNTs 152 in the CNT film 115 permits the etchant to pass through openings in the film 115 (e.g., openings 180 between the CNTs 152 in the film 115, shown in FIG. 1C) and to contact the underlying exposed portion of the layer 210, without chemically altering the CNTs 152.

For example, wet-etchants, such as buffered-oxide-etchants (BOEs), could be used to etch the portion 525 of the layer 210. Non-limiting examples of suitable BOEs include a mixture of a buffering agent such as concentrated ammonium fluoride (e.g., about 40% $NH_4F$ in water) and concentrated hydrogen fluoride (e.g. 49% HF in water), the mixture of concentrated $NH_4F$:concentrated HF provided in a ratio of about 6:1. In some embodiments such a stock BOE mixture can be further diluted (e.g., from 1 to 40 times) in water, e.g., to adjust the rate of etching. Such etchants can be placed in the mask layer opening 520 to dissolve the exposed portion 525 of the stoichiometrically oxygen-reduced silicon oxide layer 210 over a period ranging from about 0.5 to 2 minutes. As illustrated in FIG. 5F, removing the exposed portion of the layer results in a gap 215 (e.g., air gap), being formed between the substrate 110 (e.g., surface 117) and the CNT film 115. As illustrated in FIG. 5F, in some embodiments, a portion of the CNT 115 (e.g., portion 530) laying over the gap 215 can sag down below a plane 535 of the non-exposed portions (e.g., portions 545, 550) of the film 115. In some such embodiments the portion of the CNT 115 (e.g., portion 530) laying over the gap 215 can sag down to contact the surface 117 of the substrate 110.

Figure 5G:
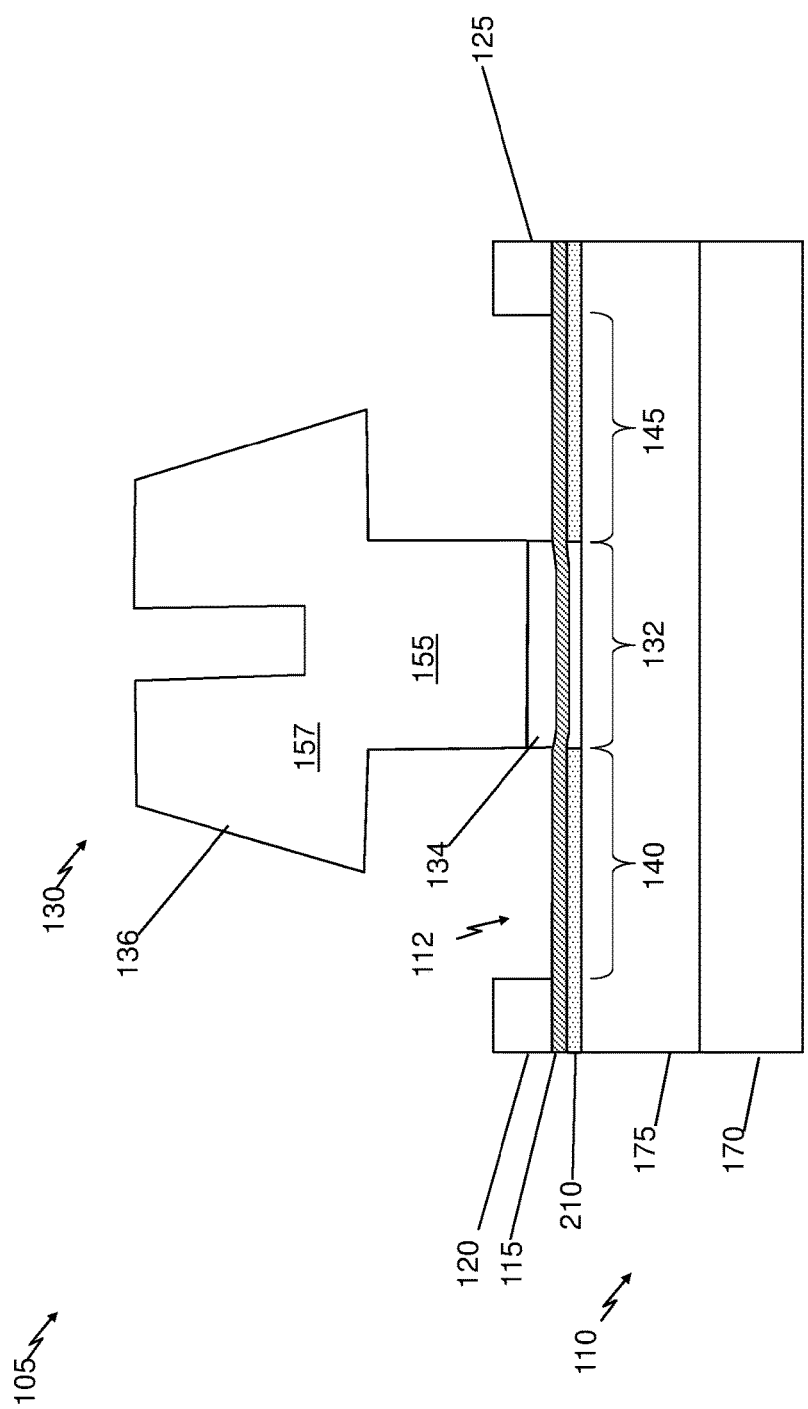

FIG. 5G shows the partially completed FET 105 after forming a gate structure 130, include a gate dielectric layer 134 and gate electrode layer 136 e.g., a T-shaped gate), on a portion 132 of the channel region 112. For instance, as part of step 425 after removing excess etchant 527 from the opening 520 as part of step 428 a gate dielectric layer 134 (e.g., silicon dioxide layer) and then gate electrode layer 136 (e.g., Pd) can be deposited in the mask layer opening 520 in accordance with step 428, and then the mask layer 505 removed. Non-limiting examples of forming such gate structures 130, including T-shaded gate electrode layers 136 with head and tail electrode layers 157, 155, are presented in Rutherglen.

As illustrated in FIG. 5G, the previously deposited stoichiometrically oxygen-reduced silicon oxide layer 210 under lays the non-gate covered portions 140, 145, and the gap 215 in the layer 210 under lays the gate-covered portion 132 of the channel region 112. Using the same gate mask layer 505 and opening 520 to remove the portion 510 of the stoichiometrically oxygen-reduced silicon oxide layer 210 and then to form the gate structure 130 advantageously ensures that there will be no misalignment between the removed portion 510 and the gate structure 130's foot-print on the substrate 110.

In some cases, the CNT FET 105 depicted in FIG. 5G may be the completed embodiment, while in other cases, the CNT FET 105 can be further subjected to a baking process e.g., step 440 to form the completed embodiment.

FIGS. 6A-6E present cross-sectional views, analogous to the view presented in FIG. 1B, to shown example CNT FETs 105 of the disclosure at intermediate stages of fabrication according to another method embodiment of the disclosure, e.g., such as disclosed in the context of FIG. 4.

Figure 6A:
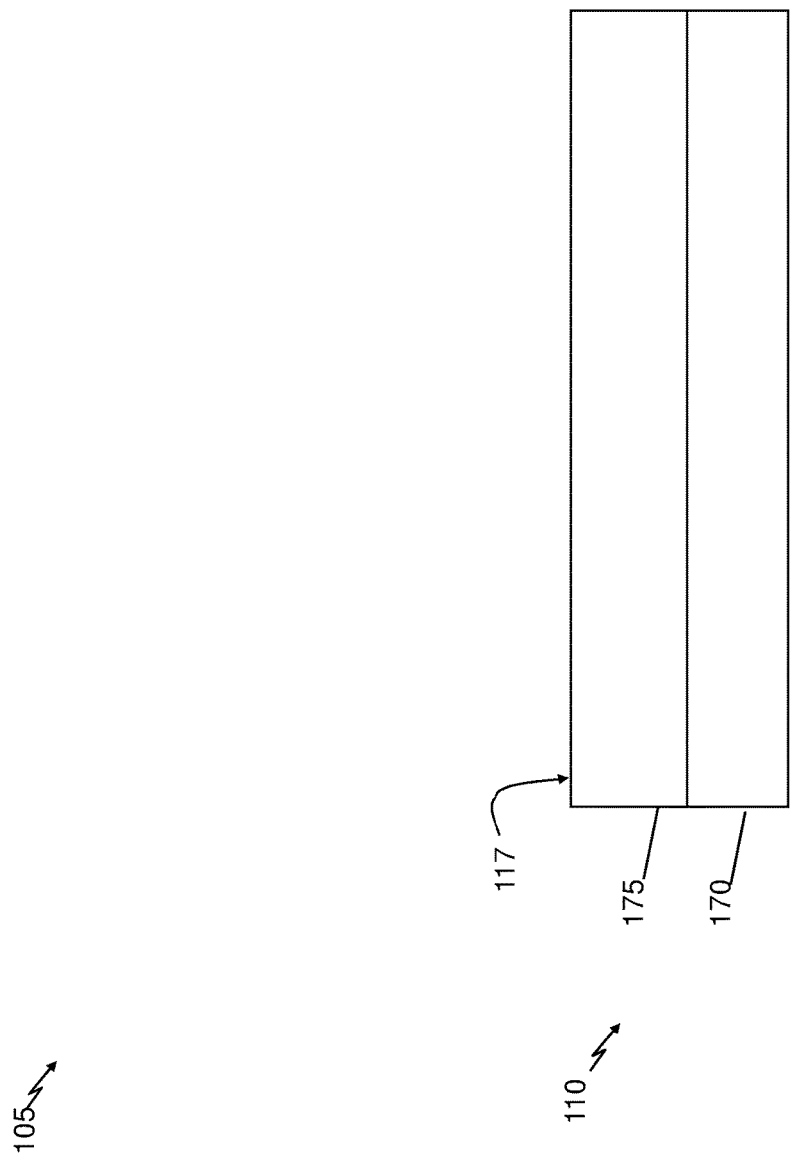

With continuing reference to FIG. 4 throughout, FIG. 6A shows the partially completed FET 105 after providing the substrate 110, e.g., in accordance with step 410.

Figure 6B:
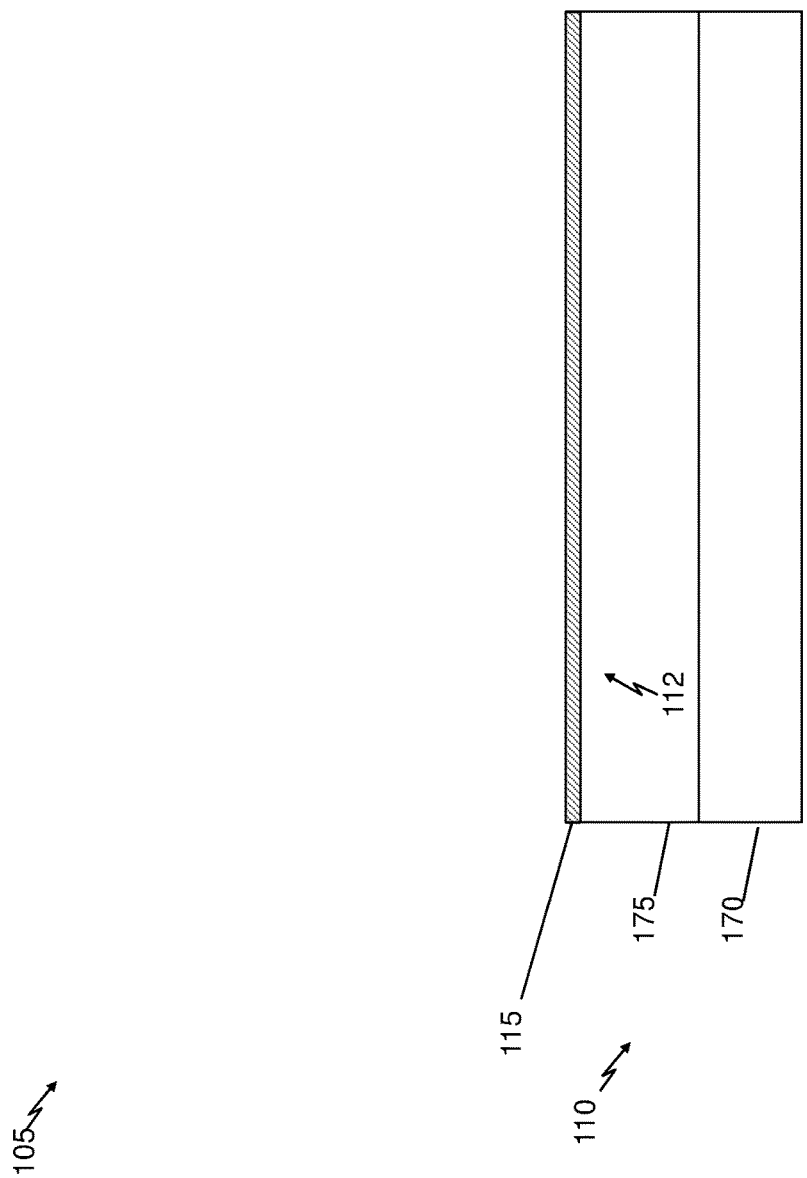

FIG. 6B shows the partially completed FET 105 after forming a channel region 112 including depositing a CNT film 115 on the substrate 110, e.g., in accordance with step 415.

Figure 6C:
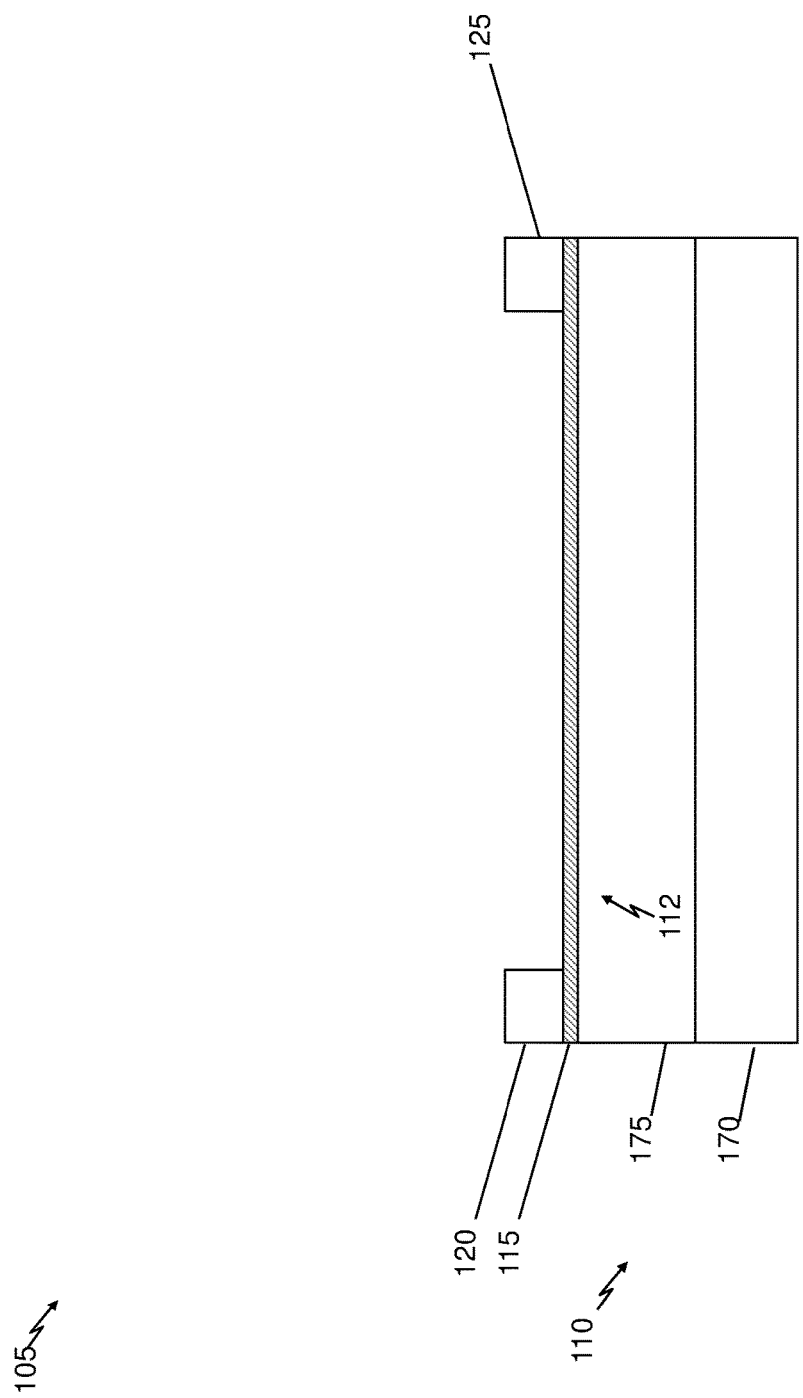

FIG. 6C shows the partially completed FET 105 after forming metallic source and drain electrodes layers 120, 125, e.g., in accordance with step 420 on the CNT film 115 and self-aligned with the channel 112 region.

Figure 6D:
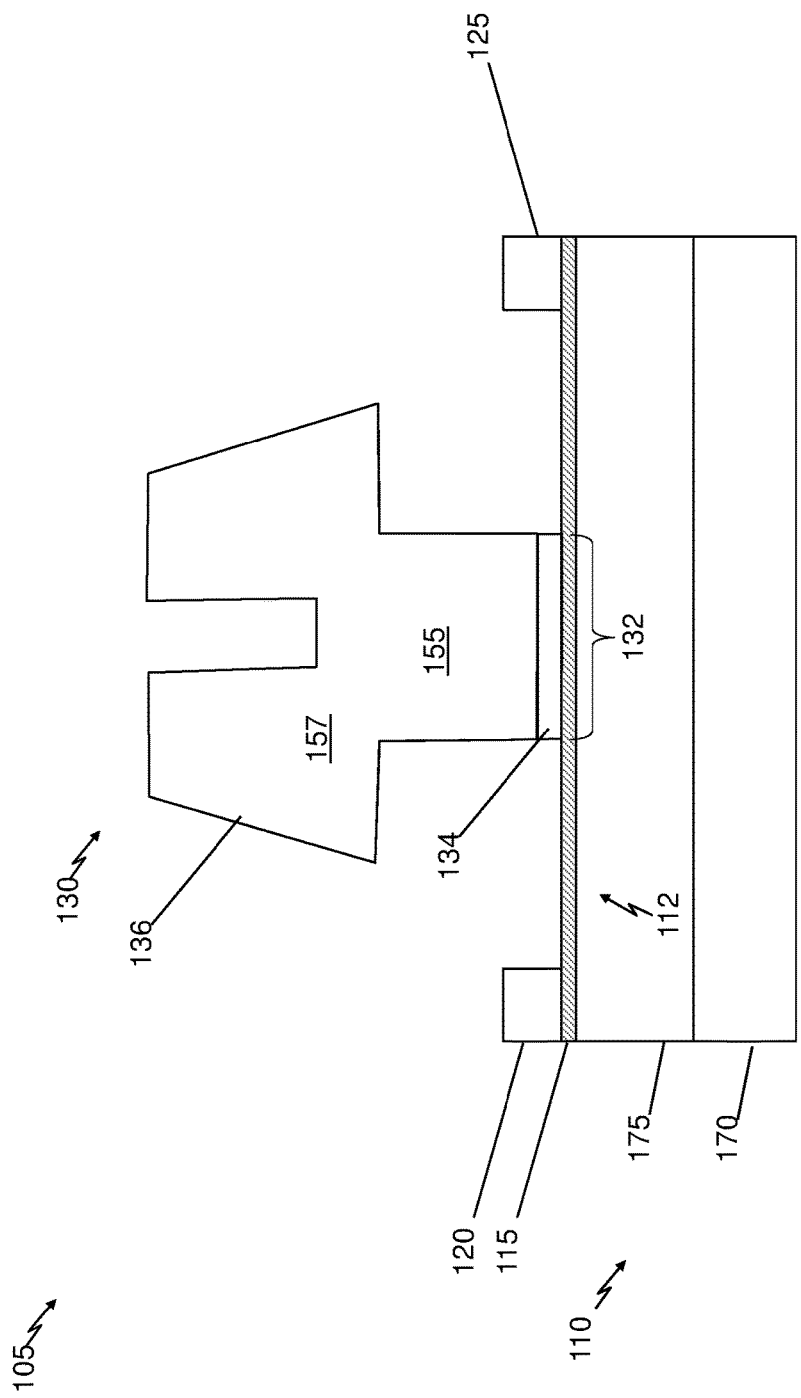

FIG. 6D shows the partially completed FET 105 after forming a gate structure 130, include a gate dielectric layer 134 and gate electrode layer 136, e.g., a T-shaped gate electrode layer, on a portion 132 of the channel region 112 e.g., in accordance with step 425. Non-limiting examples of forming the gate structure including T-shaded gate electrode layers 136 are presented in Rutherglen.

Figure 6E:
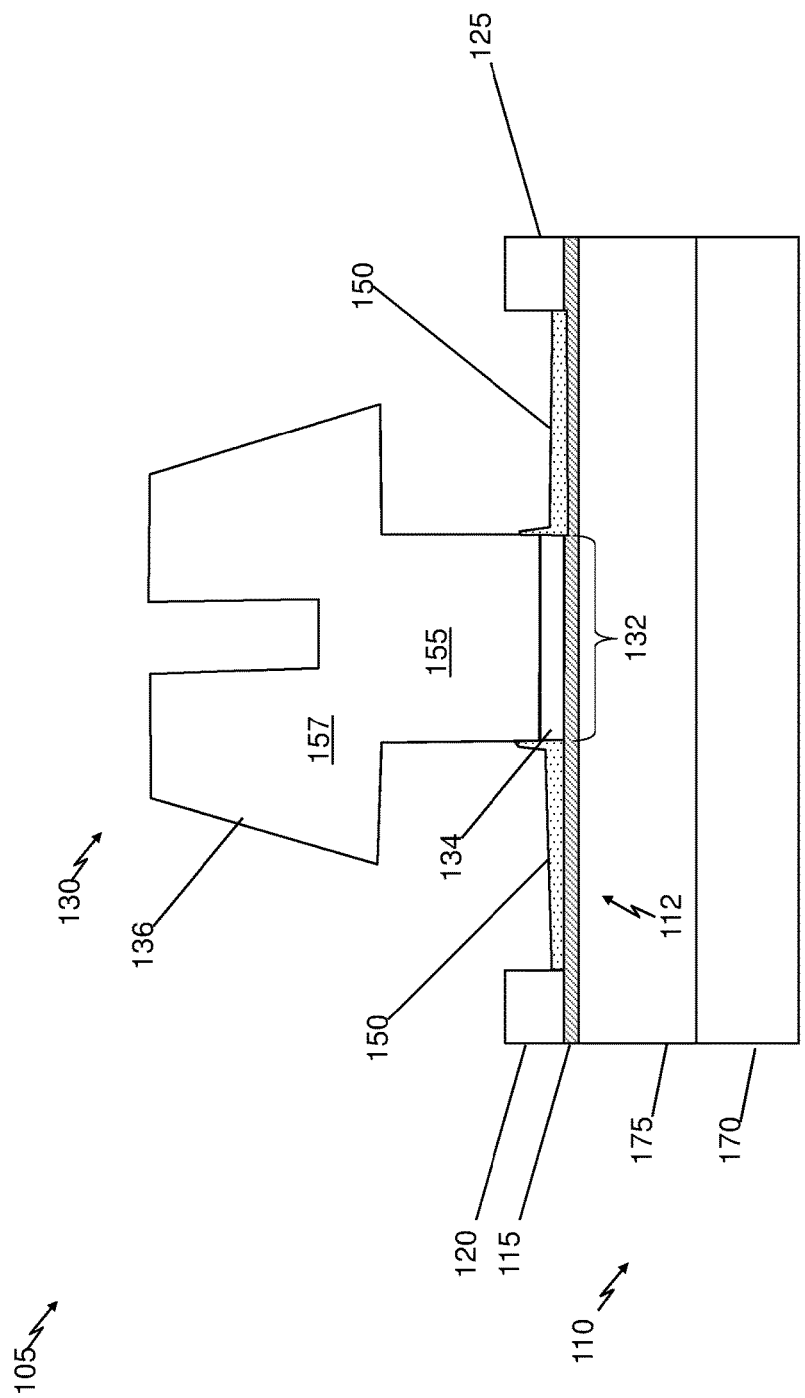

FIG. 6E shows the partially completed FET 105 after depositing (step 430) a stoichiometrically oxygen-reduced silicon oxide layer 150 on the substrate 110 after forming the channel region 112 and thereby covering the non-gate-covered portions 140, 145 of the channel region 112. Some embodiments of the depositing can included an angled deposition process (e.g., step 450).

In some cases, the CNT FET 105 depicted in FIG. 6E can be the completed embodiment, while in other cases, the CNT FET 105 can be further subjected to a baking process e.g., step 440 to form the completed embodiment.

Experimental Results

FIG. 7 shows an experimental back-gated CNT FET device 700 used to examine the effects of p-type doping in accordance with disclosure. As illustrated in FIG. 7, the device includes a substrate 110 that has a gate electrode layer 710 thereon e.g., a metallic electrode layer 710 on a silicon base layer 170 and gate dielectric layer 720 on the gate electrode layer 710. The channel region 112 of the device 700 includes the CNT film 115, and source and drain electrode layers 120, 125 are located on the CNT film 115. For some such devices, a stoichiometrically oxygen-reduced silicon oxide layer 730 is deposited between the source and drain electrode layers 120, 125 in accordance with any of the method embodiments (e.g., step 430) disclosed herein. The electrical properties of such devices 700 with and without the deposited stoichiometrically oxygen-reduced silicon oxide layer 730 were tested and compared.

FIG. 8 presents example data showing the relationship between drain current and gate voltage for an example experimental back-gated CNT FET similar to that shown in FIG. 7, either with ("after SiOx deposition") or without ("before deposition") the oxygen-reduced silicon oxide layer 730 to examine the p-type doping of the channel region 112 as provided by the oxygen-reduced silicon oxide layer 730. As illustrated in FIG. 8, channel region 112 p-doping indicates an about 5 to 10 times improvement (e.g., reduction) in device conductance at 0 gate voltage, which is the operating point of the ungated parts. Moreover, the p-doping of the underlying CNT film 115 of the channel region 112 was to such an extent that the ON-current was nearly independent of gate-voltage, e.g., less than an about 10 percent change over a gate-voltage range from −6 to +6 Volts, FIG. 9 presents example data showing the relationship between drain current and gate voltage for an example experimental back-gated CNT FET, similar to that shown in FIG. 7, with the p-type doping provided by the oxygen-reduced silicon oxide layer 730 of the disclosure, and either with ("after AZ300T+115C annealing"), or, without ("before processing") a thermal bake process. In particular, some embodiments of the device 700 with the oxygen-reduced silicon oxide layer 730 and with the thermal bake process, were exposed to the photoresist stripper AZ300T (AZ Electronic Materials USA Corp., Somerville, N.J.) and then the bake process at 115° C. for about 1 minute.

As illustrated in FIG. 9, the p-type doping effect was maintained, as signified by the ON-current being independent of gate-voltage. Indeed the baking process further reduced the ON-current dependence gate-voltage. Moreover, the p-type doping effect was unaffected by exposure to process chemicals, e.g., photoresist stripper, used in standard photolithographic processing.

Those skilled in the art to which this application relates will appreciate that other and further additions, deletions, substitutions and modifications may be made to the described embodiments.

The invention claimed is:

1. An electrical device, comprising:
a field effect transistor, including:
a substrate with a channel region thereon, the channel region including a film of single-walled carbon nanotubes located on the substrate;
metallic source and drain electrodes layers on the channel region;
a gate structure covering a portion of the channel region and located between the metallic source and drain electrode layers, the gate structure including a gate dielectric layer on the portion of the channel region and a gate electrode layer on the gate dielectric layer, wherein other non-gate-covered portions of the channel region are located between the source electrode layer and the gate structure and between the drain electrode layer and the gate structure; and
a stoichiometrically oxygen-reduced silicon oxide layer contacting the non-gate-covered portions of the channel region, wherein the stoichiometrically oxygen-reduced silicon oxide composition includes $SiO_x$ where x has a value between 1 and 2.

2. The device of claim 1, wherein the stoichiometrically oxygen-reduced silicon oxide layer composition consists essentially of SiOx.

3. The device of claim 1, wherein the stoichiometrically oxygen-reduced silicon oxide layer contacts the non-gate covered portions by covering the non-gate covered portions of the channel region.

4. The device of claim 1, wherein the stoichiometrically oxygen-reduced silicon oxide layer contacts the non-gate covered portions by having the stoichiometrically oxygen-reduced silicon oxide layer underlay the channel region such that the channel region covers the underlying stoichiometrically oxygen-reduced silicon oxide layer.

5. The device of claim 1, wherein the stoichiometrically, oxygen-reduced silicon oxide layer contacts the non-gate covered portions of the channel region by having a first layer of the stoichiometrically oxygen-reduced silicon oxide layer that underlays the non-gate covered portions of the channel region and a second layer of the stoichiometrically oxygen-reduced silicon oxide layer that covers the non-gate covered portions of the channel region.

6. The device of claim 1, wherein the gate structure includes a T-shaped gate electrode layer.

7. The device of claim 1, wherein the stoichiometrically oxygen-reduced silicon oxide layer has a thickness in a range from about 0.5 nanometers to 3 nanometers.

8. The device of claim 1, wherein the stoichiometrically oxygen-reduced silicon oxide layer has a thickness equal to or greater that an average radius of the carbon nanotubes of the channel region.

9. The device of claim 1, wherein the channel region from the source electrode layer to the drain electrode layer has a length in a range from about 100 to 1000 nanometers, and, the channel region has a width perpendicular to the length that is substantially equal to a width of the source electrode layer and the drain electrode layer in a range from about 10 to 100 nanometers.

10. The device of claim 1, wherein the portion of the channel region covered by the gate structure corresponds to a value in a range from about 10 to 90 percent of a total area of the channel region located between the source electrode layer and the drain electrode layer.

11. The device of claim 1, wherein the stoichiometrically oxygen-reduced silicon oxide layer contacts at least about 90 percent of the other non-gate covered portions of the channel region.

12. The device of claim 1, wherein the single-walled carbon nanotubes consists essentially of semiconductor single-walled carbon nanotubes.

13. The device of claim 1, wherein the substrate includes a silicon base layer and a silicon dioxide layer thereon.

14. The device of claim 1, wherein the field effect transistor is part of an amplifier device.

15. A method, comprising:
forming an electrical device having a field effect transistor, including:
providing a substrate,
forming a channel region including depositing a film of single-walled carbon nanotubes on the substrate;
forming metallic source and drain electrodes layers on the channel region;
forming a gate structure contacting a portion of the channel region and located in-between the metallic source and drain electrode layers, the gate structure including a gate dielectric layer on the portion of the channel region and a gate electrode layer on the gate dielectric layer, wherein other non-gate-covered portions of the channel region are located between the source electrode layer and the gate structure and between the drain electrode layer and the gate structure; and
depositing a stoichiometrically oxygen-reduced silicon oxide layer contacting the non-gate-covered portions of the channel region, wherein the stoichiometrically oxygen-reduced silicon oxide composition includes $SiO_x$ where x has a value between 1 and 2.

16. The method of claim 15, wherein depositing the stoichiometrically oxygen-reduced silicon oxide layer includes an electron-beam evaporation process including:
placing the substrate into a deposition chamber containing source silicon oxide crystals; and
directing an electron bean at the source silicon oxide crystals to evaporate the silicon oxide crystals.

17. The method of claim 15, wherein depositing stoichiometrically oxygen-reduced silicon oxide layer includes a thermal evaporation process including:
placing the substrate into chamber containing source silicon oxide crystals; and
heating the source silicon oxide crystals to evaporate the silicon oxide crystals.

18. The method of claim 15, wherein depositing the stoichiometrically oxygen-reduced silicon oxide layer includes depositing at a rate ranging from about 2 to 3 angstroms per second.

19. The method of claim 16, further including baking the substrate after the depositing the stoichiometrically oxygen-reduced silicon oxide layer wherein the baking includes an oxygen containing atmosphere at a temperature value in a range from 115 to 250° C. for about 1 to 10 minutes.

20. The method of claim 16, wherein depositing the stoichiometrically oxygen-reduced silicon oxide layer further includes an angled deposition process where the plane of the substrate surface forms an angle relative the average direction flow of evaporating source material in the range from 20 to 70 degrees.

* * * * *